US011386946B2

(12) United States Patent
Ayyapureddi et al.

(10) Patent No.: US 11,386,946 B2
(45) Date of Patent: Jul. 12, 2022

(54) APPARATUSES AND METHODS FOR TRACKING ROW ACCESSES

(71) Applicant: MICRON TECHNOLOGY, INC., Boise, ID (US)

(72) Inventors: Sujeet Ayyapureddi, Boise, ID (US); Donald M. Morgan, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/513,400

(22) Filed: Jul. 16, 2019

(65) Prior Publication Data
US 2021/0020223 A1 Jan. 21, 2021

(51) Int. Cl.
*G11C 11/406* (2006.01)
*G06F 9/30* (2018.01)
*G11C 16/34* (2006.01)
*G11C 11/16* (2006.01)

(52) U.S. Cl.
CPC ........ *G11C 11/406* (2013.01); *G06F 9/30134* (2013.01); *G11C 11/1657* (2013.01); *G11C 16/349* (2013.01)

(58) Field of Classification Search
None
See application file for complete search history.

(56) References Cited
U.S. PATENT DOCUMENTS

| 1,158,364 A | 10/1915 | Bibb |
| 3,633,175 A | 1/1972 | Harper |
| 5,291,198 A | 3/1994 | Dingwall et al. |
| 5,299,159 A | 3/1994 | Balistreri et al. |
| 5,422,850 A | 6/1995 | Sukegawa et al. |
| 5,638,317 A | 6/1997 | Tran |
| 5,699,297 A | 12/1997 | Yamazaki et al. |

(Continued)

FOREIGN PATENT DOCUMENTS

| CN | 1195173 A | 10/1998 |
| CN | 101038785 A | 9/2007 |

(Continued)

OTHER PUBLICATIONS

US 11,264,075 B2, 03/2022, Bell et al. (withdrawn)

(Continued)

*Primary Examiner* — Yaima Rigol
*Assistant Examiner* — Alexander J Yoon
(74) *Attorney, Agent, or Firm* — Dorsey & Whitney LLP

(57) ABSTRACT

Apparatuses and methods for tracking all row accesses in a memory device over time may be used to identify rows which are being hammered so that 'victim' rows may be identified and refreshed. A register stack may include a number of count values, each of which may track a number of accesses to a portion of the word lines of the memory device. Anytime a row within a given portion is accessed, the associated count value may be incremented. When a count value exceeds a first threshold, a second stack with a second number of count values may be used to track numbers of accesses to sub-portions of the given portion. When a second count value exceeds a second threshold, victim addresses may be provided to refresh the victim word lines associated with any of the word lines within the sub-portion.

18 Claims, 6 Drawing Sheets

(56) References Cited

U.S. PATENT DOCUMENTS

| | | |
|---|---|---|
| 5,768,196 A | 6/1998 | Bloker et al. |
| 5,933,377 A | 8/1999 | Hidaka |
| 5,943,283 A | 8/1999 | Wong et al. |
| 5,970,507 A | 10/1999 | Kato et al. |
| 5,999,471 A | 12/1999 | Choi |
| 6,002,629 A | 12/1999 | Kim et al. |
| 6,011,734 A | 1/2000 | Pappert |
| 6,061,290 A | 5/2000 | Shirley |
| 6,212,118 B1 | 4/2001 | Fujita |
| 6,310,806 B1 | 10/2001 | Higashi et al. |
| 6,317,381 B1 | 11/2001 | Gans et al. |
| 6,373,738 B1 | 4/2002 | Towler et al. |
| 6,392,952 B1 | 5/2002 | Chen et al. |
| 6,424,582 B1 | 7/2002 | Ooishi |
| 6,434,064 B2 | 8/2002 | Nagai |
| 6,452,868 B1 | 9/2002 | Fister |
| 6,480,931 B1 | 11/2002 | Buti et al. |
| 6,515,928 B2 | 2/2003 | Sato et al. |
| 6,567,340 B1 | 5/2003 | Nataraj et al. |
| 6,950,364 B2 | 9/2005 | Kim |
| 7,027,343 B2 | 4/2006 | Sinha et al. |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,283,380 B1 | 10/2007 | Srinivasan et al. |
| 7,319,602 B1 | 1/2008 | Srinivasan et al. |
| 7,444,577 B2 | 10/2008 | Best et al. |
| 7,551,502 B2 | 6/2009 | Dono et al. |
| 7,565,479 B2 | 7/2009 | Best et al. |
| 7,830,742 B2 | 11/2010 | Han |
| 8,174,921 B2 | 5/2012 | Kim et al. |
| 8,400,805 B2 | 3/2013 | Yoko |
| 8,451,677 B2 | 5/2013 | Okahiro et al. |
| 8,625,360 B2 | 1/2014 | Iwamoto et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,058,900 B2 | 6/2015 | Kang |
| 9,087,554 B1 | 7/2015 | Park |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,251,885 B2 | 2/2016 | Greenfield et al. |
| 9,286,964 B2 | 3/2016 | Halbert et al. |
| 9,299,457 B2 | 3/2016 | Chun et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,412,432 B2 | 8/2016 | Narui et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,646,672 B1 | 5/2017 | Kim et al. |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,734,887 B1 | 8/2017 | Tavva |
| 9,741,409 B2 | 8/2017 | Jones et al. |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,818,469 B1 | 11/2017 | Kim et al. |
| 9,847,118 B1 | 12/2017 | Won |
| 9,865,326 B2 | 1/2018 | Bains et al. |
| 9,865,328 B1 | 1/2018 | Desimone et al. |
| 9,922,694 B2 | 3/2018 | Akamatsu |
| 9,934,143 B2 | 4/2018 | Bains et al. |
| 9,953,696 B2 | 4/2018 | Kim |
| 10,032,501 B2 | 7/2018 | Ito et al. |
| 10,083,737 B2 | 9/2018 | Bains et al. |
| 10,090,038 B2 | 10/2018 | Shin |
| 10,134,461 B2 | 11/2018 | Bell et al. |
| 10,147,472 B2 | 12/2018 | Jones et al. |
| 10,153,031 B2 | 12/2018 | Akamatsu |
| 10,170,174 B1 | 1/2019 | Ito et al. |
| 10,176,860 B1 | 1/2019 | Mylavarapu |
| 10,210,925 B2 | 2/2019 | Bains et al. |
| 10,297,305 B1 | 5/2019 | Moon et al. |
| 10,339,994 B2 | 7/2019 | Ito et al. |
| 10,381,327 B2 | 8/2019 | Ramachandra et al. |
| 10,387,276 B2 | 8/2019 | Ryu et al. |
| 10,446,216 B2 | 10/2019 | Oh et al. |
| 10,490,251 B2 | 11/2019 | Wolff |
| 10,600,462 B2 | 3/2020 | Augustine et al. |
| 10,600,491 B2 | 3/2020 | Chou et al. |
| 10,607,686 B2 | 3/2020 | Akamatsu |
| 10,629,286 B2 | 4/2020 | Lee et al. |
| 10,679,710 B2 | 6/2020 | Hirashima et al. |
| 10,705,900 B2 | 7/2020 | Jin |
| 10,770,127 B2 | 9/2020 | Shore et al. |
| 10,811,066 B2 | 10/2020 | Jones et al. |
| 10,832,792 B1 | 11/2020 | Penney et al. |
| 10,861,519 B2 | 12/2020 | Jones et al. |
| 10,867,660 B2 | 12/2020 | Akamatsu |
| 10,930,335 B2 | 2/2021 | Bell et al. |
| 10,943,636 B1 | 3/2021 | Wu et al. |
| 10,950,289 B2 | 3/2021 | Ito et al. |
| 10,964,378 B2 | 3/2021 | Ayyapureddi et al. |
| 11,011,215 B1 | 5/2021 | Parry et al. |
| 11,043,254 B2 | 6/2021 | Enomoto et al. |
| 11,139,015 B2 | 10/2021 | Brown et al. |
| 11,152,050 B2 | 10/2021 | Morohashi et al. |
| 11,158,364 B2 | 10/2021 | Penney et al. |
| 11,158,373 B2 | 10/2021 | Penney et al. |
| 11,200,942 B2 | 12/2021 | Jenkinson et al. |
| 11,222,682 B1 | 1/2022 | Enomoto et al. |
| 11,257,535 B2 | 2/2022 | Shore et al. |
| 11,264,096 B2 | 3/2022 | Schreck et al. |
| 2001/0008498 A1 | 7/2001 | Ooishi |
| 2002/0007476 A1 | 1/2002 | Kishino |
| 2002/0078311 A1 | 6/2002 | Matsuzaki et al. |
| 2002/0080677 A1 | 6/2002 | Watanabe et al. |
| 2002/0181301 A1 | 12/2002 | Takahashi et al. |
| 2003/0063512 A1 | 4/2003 | Takahashi et al. |
| 2003/0067825 A1 | 4/2003 | Shimano et al. |
| 2003/0090400 A1 | 5/2003 | Barker |
| 2003/0123301 A1 | 7/2003 | Jang et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0052142 A1 | 3/2004 | Ikehashi et al. |
| 2004/0114446 A1 | 6/2004 | Takahashi et al. |
| 2004/0130959 A1 | 7/2004 | Kawaguchi |
| 2004/0174757 A1 | 9/2004 | Garverick et al. |
| 2004/0184323 A1 | 9/2004 | Mori et al. |
| 2004/0218431 A1 | 11/2004 | Chung et al. |
| 2005/0041502 A1 | 2/2005 | Perner |
| 2005/0105315 A1 | 5/2005 | Shin et al. |
| 2005/0243629 A1 | 11/2005 | Lee |
| 2005/0265104 A1 | 12/2005 | Remaklus et al. |
| 2006/0083099 A1 | 4/2006 | Bae et al. |
| 2006/0087903 A1 | 4/2006 | Riho et al. |
| 2006/0176744 A1 | 8/2006 | Stave |
| 2006/0262616 A1 | 11/2006 | Chen |

(56) References Cited

U.S. PATENT DOCUMENTS

| | | |
|---|---|---|
| 2007/0008799 A1 | 1/2007 | Dono et al. |
| 2007/0014174 A1 | 1/2007 | Ohsawa |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0133330 A1 | 6/2007 | Ohsawa |
| 2007/0230264 A1 | 10/2007 | Eto |
| 2007/0237016 A1 | 10/2007 | Miyamoto et al. |
| 2007/0297252 A1 | 12/2007 | Singh |
| 2008/0028260 A1 | 1/2008 | Oyagi et al. |
| 2008/0931068 | 2/2008 | Yoo et al. |
| 2008/0062742 A1 | 3/2008 | Wang |
| 2008/0126893 A1 | 5/2008 | Harrand et al. |
| 2008/0130394 A1 | 6/2008 | Dono et al. |
| 2008/0181048 A1 | 7/2008 | Han |
| 2008/0224742 A1 | 9/2008 | Pomichter |
| 2008/0253212 A1 | 10/2008 | Iida et al. |
| 2008/0266990 A1 | 10/2008 | Loeffler |
| 2008/0288720 A1 | 11/2008 | Atwal et al. |
| 2008/0301362 A1 | 12/2008 | Cavanna et al. |
| 2008/0316845 A1 | 12/2008 | Wang et al. |
| 2009/0021999 A1 | 1/2009 | Tanimura et al. |
| 2009/0059641 A1 | 3/2009 | Jeddeloh |
| 2009/0077571 A1 | 3/2009 | Gara et al. |
| 2009/0161457 A1 | 6/2009 | Wakimoto |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0213675 A1 | 8/2009 | Shino |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0054011 A1 | 3/2010 | Kim |
| 2010/0074042 A1 | 3/2010 | Fukuda et al. |
| 2010/0080074 A1 | 4/2010 | Ohmaru et al. |
| 2010/0110809 A1 | 5/2010 | Kobayashi et al. |
| 2010/0110810 A1 | 5/2010 | Kobayashi |
| 2010/0131812 A1 | 5/2010 | Mohammad |
| 2010/0157693 A1 | 6/2010 | Iwai et al. |
| 2010/0182863 A1 | 7/2010 | Fukiage |
| 2010/0329069 A1 | 12/2010 | Ito et al. |
| 2011/0026290 A1 | 2/2011 | Noda et al. |
| 2011/0051530 A1 | 3/2011 | Kushida |
| 2011/0055495 A1 | 3/2011 | Remaklus, Jr. et al. |
| 2011/0069572 A1 | 3/2011 | Lee et al. |
| 2011/0122987 A1 | 5/2011 | Neyer |
| 2011/0216614 A1 | 9/2011 | Hosoe |
| 2011/0225355 A1 | 9/2011 | Kajigaya |
| 2011/0286271 A1 | 11/2011 | Chen |
| 2011/0310648 A1 | 12/2011 | Iwamoto et al. |
| 2011/0317462 A1 | 12/2011 | Gyllenhammer et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0213021 A1 | 8/2012 | Riho et al. |
| 2012/0254472 A1 | 10/2012 | Ware et al. |
| 2013/0003467 A1 | 1/2013 | Klein |
| 2013/0003477 A1 | 1/2013 | Park et al. |
| 2013/0057173 A1 | 3/2013 | Yao et al. |
| 2013/0107623 A1 | 5/2013 | Kavalipurapu et al. |
| 2013/0173971 A1 | 7/2013 | Zimmerman |
| 2013/0254475 A1 | 9/2013 | Perego et al. |
| 2013/0279284 A1 | 10/2013 | Jeong |
| 2013/0304982 A1 | 11/2013 | Jung et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0078845 A1 | 3/2014 | Song |
| 2014/0089576 A1 | 3/2014 | Bains et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0136763 A1 | 5/2014 | Li et al. |
| 2014/0143473 A1 | 5/2014 | Kim et al. |
| 2014/0177370 A1 | 6/2014 | Halbert et al. |
| 2014/0189215 A1 | 7/2014 | Kang et al. |
| 2014/0189228 A1 | 7/2014 | Greenfield et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0269021 A1 | 9/2014 | Yang et al. |
| 2014/0281206 A1 | 9/2014 | Crawford et al. |
| 2014/0281207 A1 | 9/2014 | Mandava et al. |
| 2014/0292375 A1 | 10/2014 | Angelini et al. |
| 2014/0293725 A1 | 10/2014 | Best et al. |
| 2014/0317344 A1 | 10/2014 | Kim |
| 2014/0355332 A1 | 12/2014 | Youn et al. |
| 2014/0369109 A1 | 12/2014 | Lee et al. |
| 2014/0379978 A1 | 12/2014 | Kim et al. |
| 2015/0049567 A1 | 2/2015 | Chi |
| 2015/0055420 A1 | 2/2015 | Bell et al. |
| 2015/0078112 A1 | 3/2015 | Huang |
| 2015/0089326 A1 | 3/2015 | Joo et al. |
| 2015/0155027 A1 | 6/2015 | Abe et al. |
| 2015/0162067 A1 | 6/2015 | Kirn et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0213877 A1 | 7/2015 | Darel |
| 2015/0228341 A1 | 8/2015 | Watanabe et al. |
| 2015/0243339 A1 | 8/2015 | Bell et al. |
| 2015/0255140 A1 | 9/2015 | Song |
| 2015/0262652 A1 | 9/2015 | Igarashi |
| 2015/0279441 A1* | 10/2015 | Greenberg .......... G11C 11/406 365/49.1 |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1* | 2/2016 | Narui .................... G11C 11/406 365/222 |
| 2016/0078845 A1 | 3/2016 | Lin et al. |
| 2016/0078911 A1 | 3/2016 | Fujiwara et al. |
| 2016/0078918 A1 | 3/2016 | Hyun et al. |
| 2016/0086649 A1 | 3/2016 | Hong et al. |
| 2016/0086651 A1 | 3/2016 | Kim |
| 2016/0093402 A1 | 3/2016 | Kitagawa et al. |
| 2016/0099043 A1 | 4/2016 | Tu |
| 2016/0111140 A1 | 4/2016 | Joo et al. |
| 2016/0125931 A1 | 5/2016 | Doo et al. |
| 2016/0133314 A1 | 5/2016 | Hwang et al. |
| 2016/0140243 A1 | 5/2016 | Adams et al. |
| 2016/0163372 A1 | 6/2016 | Lee et al. |
| 2016/0172056 A1* | 6/2016 | Huh .................... G11C 16/349 714/719 |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0211008 A1 | 7/2016 | Benedict et al. |
| 2016/0225433 A1 | 8/2016 | Bains et al. |
| 2016/0225461 A1 | 8/2016 | Tuers et al. |
| 2016/0336060 A1 | 11/2016 | Shin |
| 2016/0343423 A1 | 11/2016 | Shido |
| 2017/0011792 A1 | 1/2017 | Oh et al. |
| 2017/0076779 A1 | 3/2017 | Bains et al. |
| 2017/0092350 A1 | 3/2017 | Halbert et al. |
| 2017/0117030 A1 | 4/2017 | Fisch et al. |
| 2017/0133085 A1 | 5/2017 | Kim et al. |
| 2017/0139641 A1 | 5/2017 | Cha et al. |
| 2017/0140807 A1 | 5/2017 | Sun et al. |
| 2017/0140811 A1 | 5/2017 | Joo |
| 2017/0148504 A1 | 5/2017 | Saifuddin et al. |

(56) References Cited

U.S. PATENT DOCUMENTS

| | | |
|---|---|---|
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0287547 A1 | 10/2017 | Ito et al. |
| 2017/0323675 A1 | 11/2017 | Jones et al. |
| 2017/0352399 A1 | 12/2017 | Yokoyama et al. |
| 2017/0371742 A1* | 12/2017 | Shim ............... G11C 16/26 |
| 2017/0372767 A1 | 12/2017 | Kang et al. |
| 2018/0005690 A1 | 1/2018 | Morgan. et al. |
| 2018/0025770 A1 | 1/2018 | Ito et al. |
| 2018/0025772 A1 | 1/2018 | Lee et al. |
| 2018/0060194 A1 | 3/2018 | Ryu et al. |
| 2018/0061483 A1 | 3/2018 | Morgan |
| 2018/0082737 A1 | 3/2018 | Lee |
| 2018/0084314 A1 | 3/2018 | Koyama |
| 2018/0090199 A1 | 3/2018 | Kim et al. |
| 2018/0096719 A1 | 4/2018 | Tomishimna et al. |
| 2018/0102776 A1 | 4/2018 | Chandrasekar et al. |
| 2018/0107417 A1 | 4/2018 | Shechter et al. |
| 2018/0114561 A1 | 4/2018 | Fisch et al. |
| 2018/0114565 A1 | 4/2018 | Lee |
| 2018/0158504 A1 | 6/2018 | Akamatsu |
| 2018/0182445 A1 | 6/2018 | Lee et al. |
| 2018/0203621 A1 | 7/2018 | Ahn et al. |
| 2018/0218767 A1 | 8/2018 | Wolff |
| 2018/0261268 A1 | 9/2018 | Hyun et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2018/0366182 A1 | 12/2018 | Hyun et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0066759 A1 | 2/2019 | Nale |
| 2019/0066762 A1 | 2/2019 | Koya |
| 2019/0088315 A1 | 3/2019 | Saenz et al. |
| 2019/0088316 A1 | 3/2019 | Inuzuka et al. |
| 2019/0096492 A1* | 3/2019 | Cai ............... G11C 16/349 |
| 2019/0103147 A1 | 4/2019 | Jones et al. |
| 2019/0130961 A1 | 5/2019 | Bell et al. |
| 2019/0139599 A1 | 5/2019 | Ito et al. |
| 2019/0147941 A1* | 5/2019 | Qin ............... G11C 11/419 |
| | | 711/102 |
| 2019/0147964 A1 | 5/2019 | Yun et al. |
| 2019/0161341 A1 | 5/2019 | Howe |
| 2019/0172518 A1 | 6/2019 | Chen et al. |
| 2019/0196730 A1 | 6/2019 | Imran |
| 2019/0198078 A1 | 6/2019 | Hoang et al. |
| 2019/0198096 A1 | 6/2019 | Lee |
| 2019/0198099 A1 | 6/2019 | Mirichigni et al. |
| 2019/0205253 A1 | 7/2019 | Roberts |
| 2019/0207736 A1 | 7/2019 | Ben-tovim et al. |
| 2019/0228810 A1 | 7/2019 | Jones et al. |
| 2019/0228813 A1 | 7/2019 | Nale et al. |
| 2019/0228815 A1 | 7/2019 | Morohashi et al. |
| 2019/0237132 A1 | 8/2019 | Morohashi |
| 2019/0243708 A1* | 8/2019 | Cha ............... G11C 29/74 |
| 2019/0252020 A1 | 8/2019 | Rios et al. |
| 2019/0267077 A1 | 8/2019 | Ito et al. |
| 2019/0279706 A1 | 9/2019 | Kim |
| 2019/0333573 A1 | 10/2019 | Shin et al. |
| 2019/0348100 A1 | 11/2019 | Smith et al. |
| 2019/0348102 A1 | 11/2019 | Smith et al. |
| 2019/0348103 A1 | 11/2019 | Jeong et al. |
| 2019/0348107 A1 | 11/2019 | Shin et al. |
| 2019/0349545 A1 | 11/2019 | Koh et al. |
| 2019/0362774 A1 | 11/2019 | Kuramori et al. |
| 2019/0371391 A1 | 12/2019 | Cha et al. |
| 2019/0385661 A1 | 12/2019 | Koo et al. |
| 2019/0385667 A1 | 12/2019 | Morohashi et al. |
| 2019/0386557 A1 | 12/2019 | Wang et al. |
| 2020/0005857 A1 | 1/2020 | Ito et al. |
| 2020/0075106 A1 | 3/2020 | Tokutomi et al. |
| 2020/0082873 A1 | 3/2020 | Wolff |
| 2020/0090760 A1 | 3/2020 | Purahmad et al. |
| 2020/0135263 A1 | 4/2020 | Brown et al. |
| 2020/0194050 A1 | 6/2020 | Akamatsu |
| 2020/0194056 A1 | 6/2020 | Sakurai et al. |
| 2020/0201380 A1 | 6/2020 | Murali et al. |
| 2020/0202921 A1 | 6/2020 | Morohashi et al. |
| 2020/0211626 A1 | 7/2020 | Hiscock et al. |
| 2020/0211633 A1 | 7/2020 | Okuma |
| 2020/0211636 A1 | 7/2020 | Hiscock et al. |
| 2020/0251158 A1 | 8/2020 | Shore et al. |
| 2020/0294576 A1 | 9/2020 | Brown et al. |
| 2020/0302994 A1 | 9/2020 | Enomoto et al. |
| 2020/0321049 A1 | 10/2020 | Meier et al. |
| 2020/0349995 A1 | 11/2020 | Shore et al. |
| 2020/0365208 A1 | 11/2020 | Schreck et al. |
| 2020/0381040 A1 | 12/2020 | Penney et al. |
| 2020/0395072 A1 | 12/2020 | Penney et al. |
| 2021/0005229 A1 | 1/2021 | Hiscock et al. |
| 2021/0005240 A1 | 1/2021 | Brown et al. |
| 2021/0020262 A1 | 1/2021 | Penney et al. |
| 2021/0026732 A1 | 1/2021 | Park et al. |
| 2021/0057012 A1 | 2/2021 | Ayyapureddi et al. |
| 2021/0057013 A1 | 2/2021 | Jenkinson et al. |
| 2021/0057021 A1 | 2/2021 | Wu et al. |
| 2021/0065755 A1 | 3/2021 | Kim et al. |
| 2021/0065764 A1 | 3/2021 | Cheng et al. |
| 2021/0142852 A1 | 5/2021 | Schreck et al. |
| 2021/0158851 A1 | 5/2021 | Ayyapureddi et al. |
| 2021/0158860 A1 | 5/2021 | Wu et al. |
| 2021/0158861 A1 | 5/2021 | Jeong et al. |
| 2021/0201984 A1 | 7/2021 | Khasawneh et al. |
| 2021/0225432 A1 | 7/2021 | Enomoto et al. |
| 2021/0241810 A1 | 8/2021 | Hollis et al. |
| 2021/0265504 A1 | 8/2021 | Ishizu et al. |
| 2021/0343324 A1 | 11/2021 | Brown et al. |
| 2021/0350844 A1 | 11/2021 | Morohashi et al. |
| 2021/0398592 A1 | 12/2021 | Penney et al. |
| 2021/0407583 A1 | 12/2021 | Penney et al. |

FOREIGN PATENT DOCUMENTS

| | | |
|---|---|---|
| CN | 101067972 A | 11/2007 |
| CN | 101331554 A | 12/2008 |
| CN | 101458658 A | 6/2009 |
| CN | 101622607 A | 1/2010 |
| CN | 102113058 A | 6/2011 |
| CN | 102483952 A | 5/2012 |
| CN | 104350546 A | 2/2015 |
| CN | 106710621 A | 5/2017 |
| CN | 107871516 A | 4/2018 |
| JP | H0773682 A | 3/1995 |
| JP | 2005-216429 A | 8/2005 |
| JP | 2011-258259 | 12/2011 |
| JP | 2011-258259 A | 12/2011 |
| JP | 4911510 B2 | 1/2012 |
| JP | 2013-004158 A | 1/2013 |
| KR | 20150002783 A | 1/2015 |
| KR | 20170058022 A | 5/2017 |
| KR | 1020180064940 A | 6/2018 |
| KR | 1020180085184 A | 7/2018 |
| KR | 20190048049 A | 5/2019 |
| WO | 2014120477 | 8/2014 |
| WO | 2015030991 A1 | 3/2015 |
| WO | 2017171927 A1 | 10/2017 |
| WO | 2019222960 A1 | 11/2019 |
| WO | 2020010010 A1 | 1/2020 |
| WO | 2021003085 A1 | 1/2021 |

OTHER PUBLICATIONS

Thomas, et al., "Voltage Source Based Voltage-to-Time Converter", IEEE, 2020, p. All.

U.S. Appl. No. 16/546,152 titled "Apparatuses and Methods for Analog Row Access Tracking" filed Aug. 20, 2019, pp. all.

U.S. Appl. No. 16/548,027 titled "Apparatuses, Systems, and Methods for Analog Row Access Rate Determination" filed Aug. 22, 2019, pp. all.

(56) References Cited

OTHER PUBLICATIONS

U.S. Appl. No. 16/549,942 titled "Apparatuses and Methods for Lossy Row Access Counting" filed Aug. 23, 2019, pp. all.
U.S. Appl. No. 16/797,658, titled "Apparatuses and Methods for Controlling Refresh Operations", dated Feb. 21, 2020; pp. all.
U.S. Appl. No. 15/881,256 entitled 'Apparatuses and Methods for Detecting a Row Hammer Attack With a Bandpass Filter' filed Jan. 26, 2018, pp. all.
U.S. Appl. No. 16/425,525 titled "Apparatuses and Methods for Tracking All Row Accesses" filed May 29, 2019, pp. all.
U.S. Appl. No. 16/427,105 titled "Apparatuses and Methods for Priority Targeted Refresh Operations" filed May 30, 2019, pp. all.
U.S. Appl. No. 16/427,140 titled "Apparatuses and Methods for Tracking Row Access Counts Between Multiple Register Stacks" filed May 30, 2019, pp. all.
U.S. Appl. No. 16/437,811 titled "Apparatuses, Systems, and Methods for Determining Extremum Numerical Values" filed Jun. 11, 2019, pp. all.
U.S. Appl. No. 15/789,897, entitled "Apparatus and Methods for Refreshing Memory", filed Oct. 20, 2017; pp. all.
U.S. Appl. No. 15/796,340, entitled: "Apparatus and Methods for Refreshing Memory" filed Oct. 27, 2017; pp. all.
U.S. Appl. No. 16/012,679, titled "Apparatuses and Methods for Multiple Row Hammer Refresh Address Sequences", filed Jun. 19, 2018, pp. all.
U.S. Appl. No. 16/020,863, titled "Semiconductor Device", filed Jun. 27, 2018, pp. all.
U.S. Appl. No. 16/112,471 titled "Apparatuses and Methods for Controlling Refresh Operations" filed Aug. 24, 2018, pp. all.
U.S. Appl. No. 16/160,801, titled "Apparatuses and Methods for Selective Row Refreshes" filed Oct. 15, 2018, pp. all.
U.S. Appl. No. 16/176,932, titled "Apparatuses and Methods for Access Based Refresh Timing", filed Oct. 31, 2018, pp. all.
U.S. Appl. No. 16/231,327 titled "Apparatuses and Methods for Selective Row Refreshes", filed Dec. 21, 2018, pp. all.
U.S. Appl. No. 16/237,291, titled "Apparatus and Methods for Refreshing Memory", filed Dec. 31, 2018, pp. all.
U.S. Appl. No. 16/268,818, titled "Apparatuses and Methods for Managing Row Access Counts", filed Feb. 6, 2019, pp. all.
U.S. Appl. No. 16/358,587, titled "Semiconductor Device Having Cam That Stores Address Signals", dated Mar. 19, 2019, pp. all.
U.S. Appl. No. 16/411,573 titled "Apparatuses, Systems, and Methods for a Content Addressable Memory Cell" filed May 14, 2019, pp. all.
U.S. Appl. No. 16/411,698 title "Semiconductor Device" filed May 14, 2019, pp. all.
U.S. Appl. No. 16/427,330 titled "Apparatuses and Methods for Storing Victim Row Data" filed May 30, 2019, pp. all.
U.S. Appl. No. 16/428,625 titled "Apparatuses and Methods for Tracking Victim Rows" filed May 31, 2019, pp. all.
U.S. Appl. No. 16/805,197, titled "Apparatuses and Methods for Calculating Row Hammer Refresh Addresses in a Semiconductor Device", dated Feb. 28, 2020, pp. all.
U.S. Appl. No. 15/876,566 entitled 'Apparatuses and Methods for Calculating Row Hammer Refresh Addresses in a Semiconductor Device' filed Jan. 22, 2018, pp. all.
U.S. Appl. No. 15/656,084, titled "Apparatuses and Methods for Targeted Refreshing of Memory", filed Jul. 21, 2017; pp. all.
PCT Application No. PCT/US18/55821 "Apparatus and Methods for Refreshing Memory" filed Oct. 15, 2018, pp. all.
U.S. Appl. No. 15/715,846, entitled "Semiconductor Device", filed Sep. 26, 2017, pp. all.
U.S. Appl. No. 15/888,993, entitled "Apparatuses and Methods for Controlling Refresh Operations", filed Feb. 5, 2018, pp. all.
U.S. Appl. No. 16/190,627 titled "Apparatuses and Methods for Targeted Refreshing of Memory" filed Nov. 14, 2018, pp. all.
U.S. Appl. No. 16/459,520 titled "Apparatuses and Methods for Monitoring Word Line Accesses", filed Jul. 1, 2019, pp. all.
U.S. Appl. No. 15/281,818, entitled: "Semiconductor Device" filed Sep. 30, 2016; pp. all.

Kim, et al. "Flipping Bits in MemoryWithout Accessing Them: An Experimental Study of DRAM Disturbance Errors", IEEE, Jun. 2014, 12 pgs.
U.S. Appl. No. 16/818,981 titled "Apparatuses and Methods for Staggered Timing of Targeted Refresh Operations" filed Mar. 13, 2020, pp. all.
U.S. Appl. No. 16/824,460, titled "Semiconductor Device Performing Row Hammer Refresh Operation", dated Mar. 19, 2020, pp. all.
U.S. Appl. No. 16/025,844, titled "Apparatus and Methods for Triggering Row Hammer Address Sampling", filed Jul. 2, 2018, pp. all.
U.S. Appl. No. 16/783,063, titled "Apparatus and Methods for Triggering Row Hammer Address Sampling", dated Feb. 5, 2020, pp. all.
U.S. Appl. No. 16/232,837, titled "Apparatuses and Methods for Distributed Targeted Refresh Operations", filed Dec. 26, 2018, pp. all.
U.S. Appl. No. 16/818,989, titled "Semiconductor Device Performing Row Hammer Refresh Operation", dated Mar. 13, 2020, pp. all.
International Application No. PCT/US19/64028, titled "Semiconductor Device Performing Row Hammer Refresh Operation", dated Dec. 2, 2019, pp. all.
International Application No. PCT/US20/26689, titled "Apparatuses and Methods for Staggered Timing of Targeted Refresh Operations", dated Apr. 3, 2020, pp. all.
U.S. Appl. No. 16/788,657, titled "Semiconductor Device Performing Row Hammer Refresh Operation", dated Feb. 12, 2020, pp. all.
U.S. Appl. No. 15/884,192 entitled 'Semiconductor Device Performing Row Hammer Refresh Operation' filed Jan. 30, 2018, pp. all.
U.S. Appl. No. 16/537,981 titled "Apparatuses and Methods for Controlling Targeted Refresh Rates" filed Aug. 12, 2019, pp. all.
U.S. Appl. No. 16/655,110 titled "Apparatuses and Methods for Dynamic Targeted Refresh Steals" filed Oct. 16, 2019, pp. all.
U.S. Appl. No. 16/936,297 titled "Apparatuses and Methods for Managing Row Access Counts" filed Jul. 22, 2020, pp. all.
U.S. Appl. No. 16/084,119, titled "Apparatuses and Methods for Pure-Time, Self Adopt Sampling for Row Hammer Refresh Sampling", filed Sep. 11, 2018, pp. all.
U.S. Appl. No. 16/208,217, titled "Semiconductor Device Performing Row Hammer Refresh Operation", filed Dec. 3, 2018, pp. all.
U.S. Appl. No. 16/230,300, titled "Apparatuses and Methods for Staggered Timing of Targeted Refresh Operations" filed Dec. 21, 2018, pp. all.
U.S. Appl. No. 16/286,187 titled "Apparatuses and Methods for Memory Mat Refresh Sequencing" filed Feb. 26, 2019; pp. all.
U.S. Appl. No. 16/290,730, titled "Semiconductor Device Performing Row Hammer Refresh Operation", filed Mar. 1, 2019, pp. all.
U.S. Appl. No. 16/374,623, titled "Semiconductor Device Performing Row Hammer Refresh Operation", filed Apr. 3, 2019, pp. all.
U.S. Appl. No. 16/375,716 titled "Stagger RHR Pumping Scheme Across Die Banks" filed Apr. 4, 2019; pp. all.
U.S. Appl. No. 16/431,641 titled "Apparatuses and Methods for Controlling Steal Rates" filed Jun. 4, 2019, pp. all.
U.S. Appl. No. 16/549,411 titled "Apparatuses and Methods for Dynamic Refresh Allocation" filed Aug. 23, 2019, pp. all.
U.S. Appl. No. 16/682,606, titled "Apparatuses and Methods for Distributing Row Hammer Refresh Events Across a Memory Device", filed Nov. 13, 2019, pp. all.
U.S. Appl. No. 16/886,284, titled "Apparatuses and Methods for Access Based Refresh Timing", dated May 28, 2020, pp. all.
U.S. Appl. No. 17/102,266, titled "Apparatuses and Methods for Tracking Word Line Accesses", dated Nov. 23, 2020, pp. all.
U.S. Appl. No. 17/154,945 titled "Apparatuses, Systems, and Methods for a Content Addressable Memory Cell" filed Jan. 21, 2021, pp. all.
U.S. Appl. No. 17/168,036 titled "Apparatuses and Methods for Analog Row Access Tracking" filed Feb. 4, 2021, pp. all.
U.S. Appl. No. 17/170,616 titled "Apparatuses, Systems, and Methods for Analog Row Access Rate Determination" filed Feb. 8, 2021, pp. all.
U.S. Appl. No. 16/886,284 titled "Apparatuses and Methods for Access Based Refresh Timing" filed May 28, 2020, pp. all.

(56) References Cited

OTHER PUBLICATIONS

U.S. Appl. No. 17/444,925 titled "Apparatuses and Methods for Countering Memory Attacks" filed Aug. 12, 2021.
U.S. Appl. No. 17/007,069 titled "Apparatuses and Methods for Providing Refresh Addresses" filed Aug. 31, 2020, pp. all.
U.S. Appl. No. 17/443,056 titled "Apparatuses and Methods for Multiple Row Hammer Refresh Address Sequences" filed Jul. 20, 2021, pp. all.
U.S. Appl. No. 17/153,555 titled "Apparatuses and Methods for Dynamically Allocated Aggressor Detection" filed Jan. 20, 2021, pp. all.
U.S. Appl. No. 17/201,941 titled "Apparatuses and Methods for Sketch Circuits for Refresh Binning" filed Mar. 15, 2021, pp. all.
U.S. Appl. No. 17/301,533 titled "Semiconductor Device Having Cam That Stores Address Signals" filed Apr. 6, 2021, pp. all.
U.S. Appl. No. 17/375,817 titled "Apparatuses and Methods for Monitoring Word Line Accesses" filed Jul. 14, 2021, pp. all.
U.S. Appl. No. 16/459,507 titled "Apparatuses and Methods for Adjusting Victim Data", filed Jul. 1, 2019, pp. all.
U.S. Appl. No. 17/446,710 titled "Apparatuses, Systems, and Methods for Determining Extremum Numericalvalues" filed Sep. 1, 2021.
U.S. Appl. No. 17/470,883 titled "Apparatuses and Methods for Tracking Victim Rows" filed Sep. 9, 2021.
U.S. Appl. No. 17/565,119 titled "Apparatuses and Methods for Row Hammer Counter Mat" filed Dec. 29. 2021.
U.S. Appl. No. 17/565,187 titled "Apparatuses and Methods for Row Hammer Counter Mat" filed Dec. 29, 2021.
U.S. Appl. No. 17/456,849 titled "Apparatuses, Systems, and Methods for Main Sketch and Slim Sketch Circuitfor Row Address Tracking" filed Nov. 29, 2021, pp. all pages of application as filed.

* cited by examiner

APPARATUSES AND METHODS FOR TRACKING ROW ACCESSES

BACKGROUND

Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. An auto-refresh operation may be carried out where a sequence of memory cells are periodically refreshed. Repeated access to a particular memory cell or group of memory cells (often referred to as a 'row hammer') may cause an increased rate of data degradation in nearby memory cells. In addition to the auto-refresh operations, it may be desirable to identify and refresh memory cells affected by the row hammer in a targeted refresh operation.

DETAILED DESCRIPTION

Figure 1:
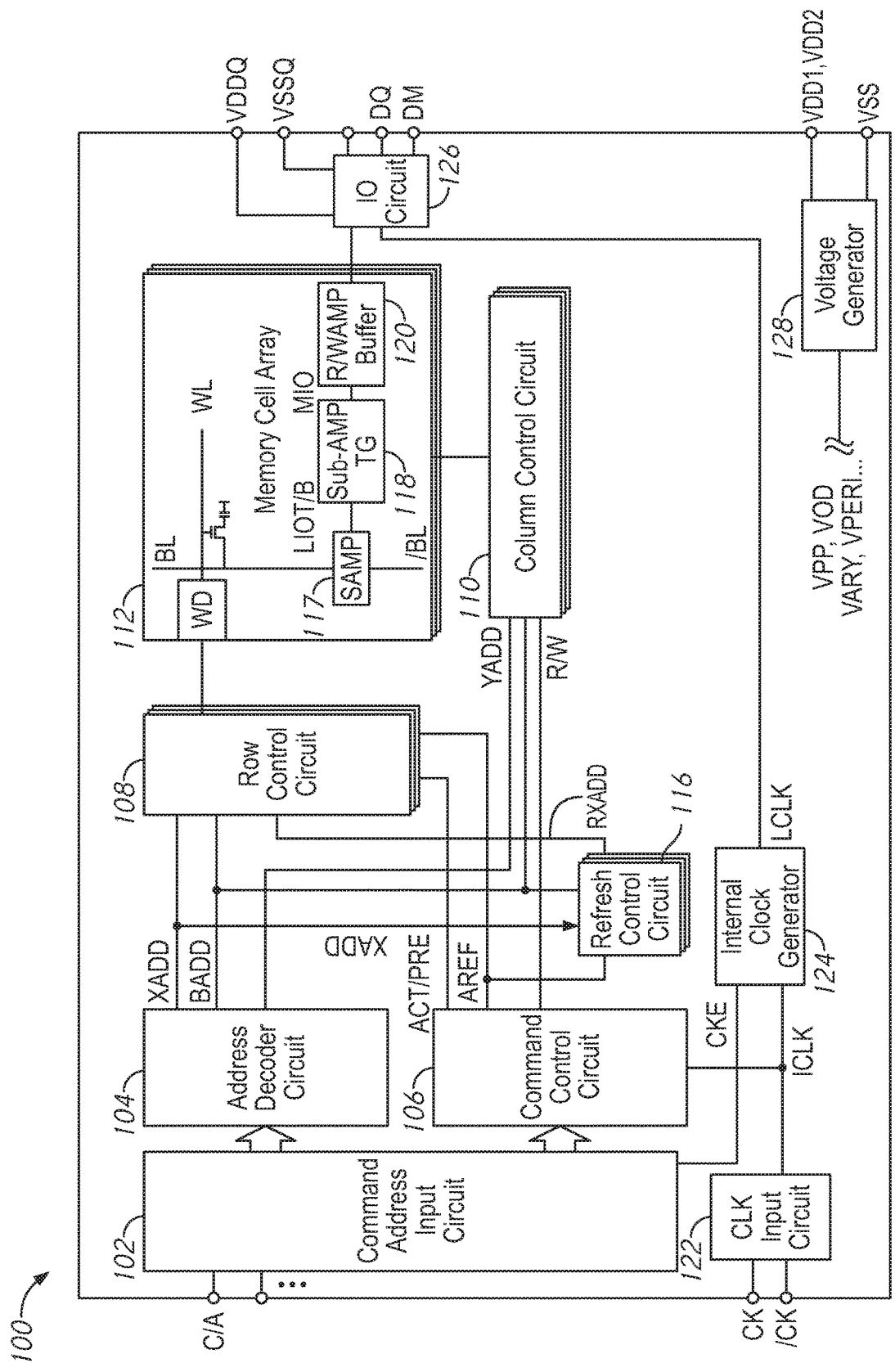
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a plurality of memory cells. The memory cells may store information (e.g., as one or more bits), and may be organized at the intersection of word lines (rows) and bit lines (columns). A number of word lines and bit lines may be organized into a memory bank. A memory device may include a number of different memory banks. The memory device may receive one or more command signals which may indicate operations in one or more of the banks of one or more memory packages. The memory device may enter a refresh operation, in which word lines in one or more of the memory banks are refreshed.

Information in the memory cells may decay over time. The memory cells may be refreshed on a row-by-row basis to preserve information in the memory cells. During a refresh operation, the information in one or more rows may be rewritten back to the respective rows to restore an initial value of the information. Repeated access to a given row (e.g., an aggressor row) may cause an increased rate of information decay in one or more neighboring rows (e.g., victim rows). Accesses to different rows of the memory may be tracked in order to determine victims and refresh them as part of a targeted (or 'row hammer') refresh operation. However, individually tracking every row access may be difficult due to space and/or power limitations of the device.

To save space and/or power, a memory device may include a data storage component, for example a register or stack of registers, which stores a number of count values, each of which may be associated with a portion of the word lines of the device (e.g., one count value may be associated with multiple word lines). The count value may be adjusted (e.g., incremented) each time any of the word lines in the associated portion are accessed. Between them, the count values may represent accesses to every word line of the device. When a count value crosses (e.g., meets or exceeds) a threshold value, one or more victim rows based on the portion of the word lines associated with the count value may be determined. In some cases, the portion of the word lines may represent one or more sections of word lines, in which all the word lines of the group are physically adjacent to one another, but this is not required. The victim addresses may be associated with each of the word lines in the portion of word lines. In some cases, all of the victim row addresses may be refreshed by one or more targeted refresh operations.

While count values that correspond to multiple word lines may save space and/or power, it may lead to excessive targeted refresh operations in some applications. For example, if a count value corresponds to accesses to sixteen word lines, when the count value exceeds the threshold value, victim row addresses for the sixteen word lines may be calculated. If victim word lines are considered to be the word lines adjacent to the word lines associated with the count value, this results in up to thirty-two victim row addresses that are provided for targeted refresh operations. If more distant word lines are considered to be victim word lines, then even more victim row addresses may be provided for targeted refresh operations (e.g., 64 row addresses, 128 row addresses). In some applications, there may not be enough time to refresh all of the victim row addresses in the time allotted for targeted refresh operations.

In many cases, it is unlikely that all of the word lines in the portion of word lines associated with a count value are being repeatedly accessed (e.g., hammered). Rather, it is likely only one or a few of the word lines are being hammered. Thus, only the victim word lines associated with the word lines actually being repeatedly accessed may benefit from targeted refresh operations. Accordingly, it may be beneficial to determine which sub-portion of the portion of word lines associated with a count value are being hammered and only refresh victim word lines associated with the sub-portion. This may reduce power consumption and/or operation time dedicated to targeted refresh operations.

The present disclosure is drawn to apparatuses, systems, and methods for tracking accesses to rows. In some embodiments, in addition to tracking accesses for a groups of rows, access to sub-portions of a group of the rows may be tracked, and victim addresses may only be generated for the sub-portions when an aggressor row is determined to be in the sub-portion. That is, a first number of word lines may be tracked (e.g., a portion) and a second number of word lines may be tracked (e.g., a sub-portion) where the second number is smaller than the first number. In some embodiments, the sub-portions may be further divided into sub-portions.

In some embodiments of the disclosure a first storage device, such as a stack of registers, stores a first number of count values, each of which may be associated with a portion of the word lines of the memory device. A count value may be adjusted each time any of the word lines in an associated portion are accessed. Between them, the count values may represent accesses to every word line of the memory device. When a count value from the first storage device crosses a first threshold value, the portion of word lines associated with the count value may be assigned to a second storage device. The second storage device may store a second number of count values, each of which may be associated with a sub-portion of the portion of word lines. A count value may be adjusted each time any of the word lines in an associated sub-portion are accessed. Between them, the count values may represent accesses to every word line of the portion of word lines. In some examples, a count value may be associated with each word line of the portion of word lines. When a count value from the second storage device crosses a second threshold value, victim word lines associated with the sub-portion of word lines may be calculated for performing targeted refresh operations.

FIG. 1 is a block diagram of a semiconductor device according to an embodiment of the disclosure. The semiconductor device 100 may be a semiconductor memory device, such as a DRAM device integrated on a single semiconductor chip.

The semiconductor device 100 includes a memory array 112. In some embodiments, the memory array 112 may include of a plurality of memory banks. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row control 108 and the selection of the bit lines BL and /BL is performed by a column control 110. In some embodiments, there may be a row control 108 and column control 110 for each of the memory banks.

The bit lines BL and /BL are coupled to a respective sense amplifier (SAMP) 117. Read data from the bit line BL or /BL is amplified by the sense amplifier SAMP 117, and transferred to read/write amplifiers 120 over complementary local data lines (LIOT/B), transfer gate (TG) 118, and complementary main data lines (MIO). Conversely, write data outputted from the read/write amplifiers 120 is transferred to the sense amplifier 117 over the complementary main data lines MIO, the transfer gate 118, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to a clock input circuit 122. The external clocks may be complementary. The clock input circuit 122 generates an internal clock ICLK based on the CK and /CK clocks. The ICLK clock is provided to the command control 106 and to an internal clock generator 124. The internal clock generator 124 provides various internal clocks LCLK based on the ICLK clock. The LCLK clocks may be used for timing operation of various internal circuits. The internal data clocks LCLK are provided to the input/output circuit 126 to time operation of circuits included in the input/output circuit 126, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row control 108 and supplies a decoded column address YADD to the column control 110. The row address XADD may be used to specify one or more word lines WL of the memory array 112 and the column address YADD may specify one or more bit lines BL of the memory array 112. The address decoder 104 may also provide a bank address BADD, which specifies a particular bank of the memory. The bank address BADD may be provided to the row control 108 and/or column control 110 to direct access operations to one or more of the banks.

The row address XADD may include multiple bits. As used herein, the different bits of the row address XADD may be labeled as RA0-RAn, where n is the total number of bits of the row address. Accordingly, RAi may refer to an ith bit of the row address XADD.

Different subsets of the bits of the row address XADD may be associated with different levels of organization of the memory array 112. For example, a subset of the bits of the row address XADD may be a section address which refers to a section of the memory array 112 containing a number of word lines and a different subset of the bits of the row address XADD may be a word line address which refers to a particular word line within that section. Different arrangements of the row address and word lines may be used in other embodiments. Although properties and uses of the row address are generally described herein, it should be understood that the column addresses may be organized and used in a similar way in some embodiments.

The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and/or bank address BADD to indicate the memory cell(s) to be accessed.

The commands may be provided as internal command signals to a command control 106 via the command/address input circuit 102. The command control 106 includes circuits to decode the internal command signals to generate various internal signals and commands for performing operations. For example, the command control 106 may provide a row command signal to select a word line and a column command signal to select a bit line.

The device 100 may receive an access command which is a row activation command ACT. When the row activation command ACT is received, a row address XADD is supplied with the row activation command ACT.

The device 100 may receive an access command which is a read command. When a read command is received, a bank address BADD and a column YADD address are timely supplied with the read command, read data is read from memory cells in the memory array 112 corresponding to the row address XADD and column address YADD. The read command is received by the command control 106, which provides internal commands so that read data from the memory array 112 is provided to the read/write amplifiers 120. The read data is output to outside from the data terminals DQ via the input/output circuit 126.

The device 100 may receive an access command which is a write command. When the write command is received, a bank address and a column address are timely supplied with the write command, write data supplied to the data terminals DQ is written to a memory cells in the memory array 112 corresponding to the row address and column address. The write command is received by the command control 106, which provides internal commands so that the write data is received by data receivers in the input/output circuit 126. Write clocks may also be provided to the external clock terminals for timing the receipt of the write data by the data receivers of the input/output circuit 126. The write data is supplied via the input/output circuit 126 to the read/write amplifiers 120, and by the read/write amplifiers 120 to the memory array 112 to be written into the memory cell MC.

The device 100 may also receive commands causing it to carry out refresh operations. A refresh signal AREF may be a pulse signal which is activated when the command control 106 receives a signal which indicates a refresh command. In some embodiments, the refresh command may be externally issued to the memory device 100. In some embodiments, the refresh command may be periodically generated by a component of the device. In some embodiments, when an external signal indicates a refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF to stop and return to an IDLE state.

The refresh signal AREF is supplied to a refresh control circuit 116. In some embodiments, there may be a refresh control circuit 116 associated with each bank. The bank address BADD may indicate one or more of the refresh control circuits 116 to be activated. The refresh control circuits 116 may receive the refresh signal AREF in common, and may generate and provide one or more refresh row address(es) RXADD in order to perform one or more refresh operations in the associated memory bank. In some embodiments, a subset of the memory banks may be given refresh commands. For example, one or more additional signals may indicate which of the refresh control circuits 116 should provide refresh address(es) responsive to AREF. In another example, AREF may only be provided to refresh control circuits 116 which are associated with the subset of memory banks which are refreshing.

Focusing on the operation of a given refresh control circuit, the refresh control circuit 116 supplies a refresh row address RXADD to the row control 108, which may refresh one or more word lines WL indicated by the refresh row address RXADD. The refresh control circuit 116 may control a timing of the refresh operation based on the refresh signal AREF. In some embodiments, responsive to an activation of AREF, the refresh control circuit 116 may generate one or more activations of a pump signal, and may generate and provide a refresh address RXADD for each activation of the pump signal (e.g., each pump).

One type of refresh operation may be an auto-refresh operation. Responsive to an auto-refresh operation the memory bank may refresh a group of rows of the memory, and then may refresh a next group of rows of the memory bank responsive to a next auto-refresh operation. The refresh control circuit 116 may provide a refresh address RXADD which indicates a group of word lines in the memory bank. The refresh control circuit 116 may generate a sequence of refresh addresses RXADD such that over time the auto-refresh operation may cycle through all the word lines WL of the memory bank. The timing of refresh operations may be such that each word line is refreshed with a frequency based on a normal rate of data degradation in the memory cells.

Another type of refresh operation may be a targeted refresh operation. Repeated access to a particular row of memory (e.g., an aggressor row) may cause an increased rate of decay in neighboring rows (e.g., victim rows) due, for example, to electromagnetic coupling between the rows. In some embodiments, the victim rows may include rows which are physically adjacent to the aggressor row. In some embodiments, the victim rows may include rows further away from the aggressor row. Information in the victim rows may decay at a rate such that data may be lost if they aren't refreshed before the next auto-refresh operation of that row. In order to prevent information from being lost, it may be necessary to identify aggressor rows and then carry out a targeted refresh operation where a refresh address RXADD associated with one or more associated victim rows is refreshed.

The refresh control circuit 116 may receive the row addresses XADD provided by the address decoder 104 and may determine which word lines are being hammered based on the row addresses XADD. The refresh control circuit 116 may count accesses to the word lines based on the row address XADD and may determine which word lines are aggressors based on the count of the accesses. The refresh control circuit 116 may divide the total number of word lines into portions and have a counter value for each of the portions. For example, a first portion of the word lines may be associated with a first count value, a second portion of the word lines may be associated with a second count value, etc. In some embodiments, the portion of the word lines associated with the count value may be organized into one or more sections of word lines each of which contain one or more word lines which are physically adjacent to each other, but this is not required. Each count value may be updated any time any of the word lines in the portion represented by the count value is accessed. In this manner all accesses to all word lines may be tracked by the count values, but there may be fewer count values than the number of total word lines.

In some embodiments, word lines may be grouped together based on the row addresses associated with those word lines. If only a particular subset of the row address is specified (e.g., a particular value of that subset of bits) then all word lines which share the specified value of that subset as part of their row address may be identified. For example, each portion of the word lines tracked by a counter value may be specified by a particular value of a subset of the row address XADD. If a row address contains a first subset (e.g., a section address) specifying a section of word lines and a second subset (e.g., a word line address) specifying a particular word line within that section, then the word line address subset of the row address may be ignored, and the refresh control circuit 116 may have a counter value associated with the value of the section address. Accordingly, the count value may be updated anytime any word line within the section(s) associated with the section address. In some embodiments, the section address may be truncated (e.g., some of the bits of the section address may be ignored) into a multi-section address, which represents all of the word lines in a number of different sections. Each count value may be specified by a particular value of the grouped section address and may represent accesses to any word line in any of the sections associated with the multi-section address. It should be understood that a row address XADD may include many subsets describing many different levels of organization. Other methods associating groups of word lines with a counter value may be used in other embodiments.

When the refresh control circuit 116 determines that the count value for a portion of word lines exceeds a first threshold value, the refresh control circuit 116 may begin to count accesses to sub-portions of the portion of word lines associated with the count value. A count value may be associated with each sub-portion. Each count value may be updated any time any of the word lines in the sub-portion represented by the count value is accessed. In some examples, each sub-portion may include a single word line. When the refresh control circuit 116 determines that the count value for a sub-portion of word lines exceeds a second threshold value, one or more victim addresses associated with the word line(s) of the sub-portion may be provided. The refresh control circuit 116 may provide a number of victim addresses for each determined aggressor address. If the counter value represents a number of different word lines, victim addresses may be provided for each of the word lines in the group associated with a given counter value. In some applications, providing victim addresses for only a sub-portion of the portion of word lines may reduce a number of targeted refreshes required to be performed to mitigate row hammer effects. In some applications, this may reduce unnecessary refreshing of victim word lines.

The power supply terminals are supplied with power supply potentials VDD and VSS. The power supply potentials VDD and VSS are supplied to an internal voltage generator circuit 128. The internal voltage generator circuit 128 generates various internal potentials VPP, VOD, VARY, VPERI, and the like based on the power supply potentials VDD and VSS supplied to the power supply terminals. The internal potential VPP is mainly used in the row control 108, the internal potentials VOD and VARY are mainly used in the sense amplifiers SAMP included in the memory array 112, and the internal potential VPERI is used in many peripheral circuit blocks.

The power supply terminals are also supplied with power supply potentials VDDQ and VSSQ. The power supply potentials VDDQ and VSSQ are supplied to the input/output circuit 126. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 126 so that power supply noise generated by the input/output circuit 126 does not propagate to the other circuit blocks.

Figure 2:
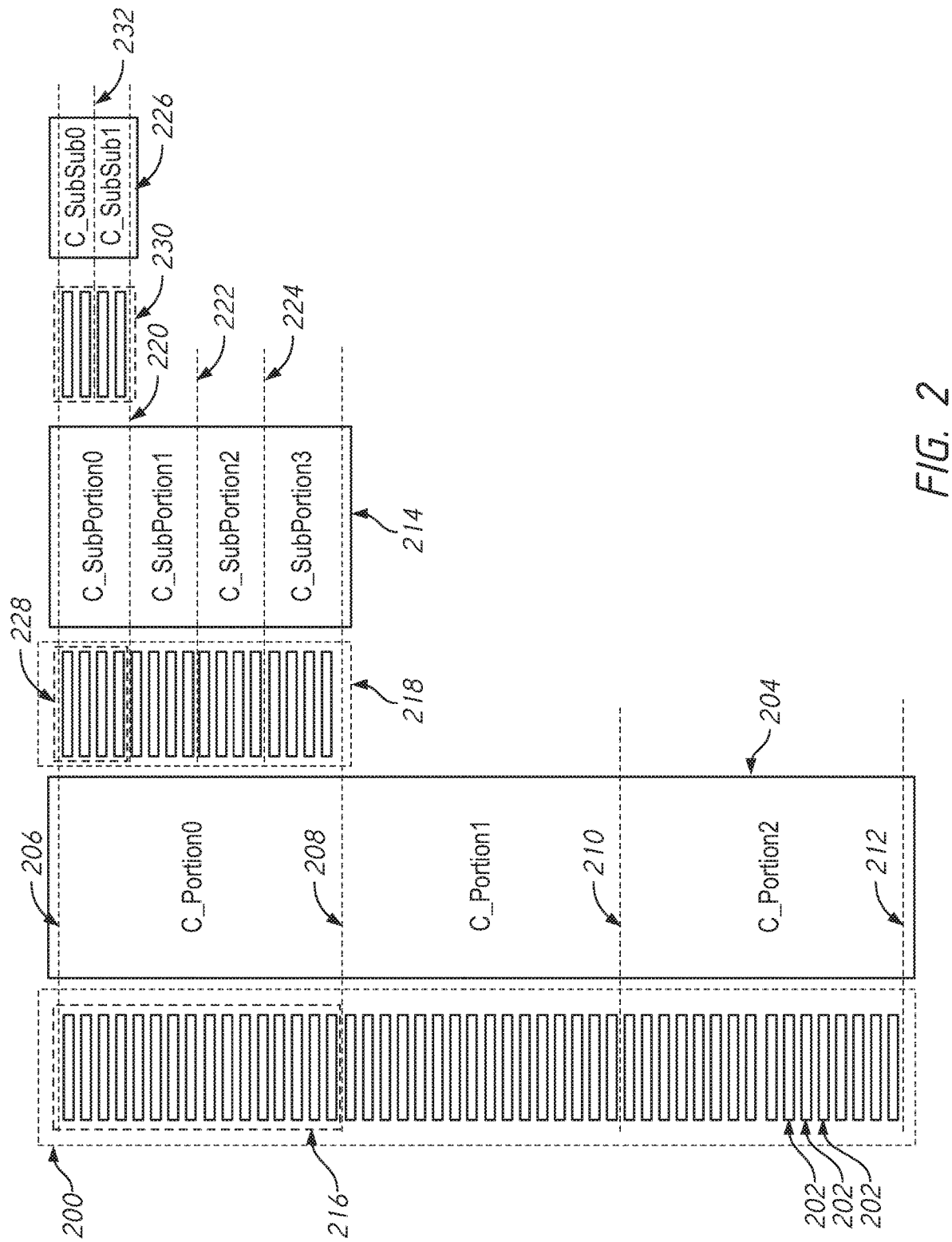
FIG. 2 is a diagram illustrating the grouping of word lines for tracking row accesses according to an embodiment of the disclosure

FIG. 2 is a diagram illustrating the grouping of word lines for tracking row accesses according to an embodiment of the disclosure. A memory 200 may include multiple word lines 202. Accesses to all of the word lines 202 may be tracked by a first storage device 204. The storage device 204 may store a number of count values C_Portion0-2. Each count value C_Portion0-2 may be associated with a portion of the word lines 202 (e.g., a group of word lines, a number of word lines). The memory 200 may have a first number of word lines 202 and each count value may be associated with a second number of word lines. The second number of word lines may be less than the first number. In the example shown in FIG. 2, count value C_Portion0 tracks accesses to the word lines 202 between lines 206 and 208; count value C_Portion1 tracks accesses to the word lines 202 between lines 208 and 210; and count value C_Portion2 tracks accesses to the word lines between lines 210 and 212. As shown in FIG. 2, all of the portions of the word lines 202 associated with the count values C_Portion0-2 may correspond to all of the word lines 202 in the memory 200.

According to principles of the present disclosure, sub-portions of a portion of the word lines 202 may be tracked by a second storage device 214. Box 216 indicates the portion of word lines 202 associated with count value C_Portion0 in storage device 204. As an example, this same portion of word lines 202 is illustrated in box 218. The second storage device 214 may store a number of count values C_Subportion0-3. Each count value C_Subportion0-3 may be associated with a portion of the word lines 202 in the portion of word lines 202 indicated by box 218. That is, each count value C_Subportion0-3 may be associated with a sub-portion of the word lines 202 of box 218. The portion of word lines 202 indicated by box 218 may include the second number of word lines. Each count value C_Subportion0-3 may be associated with a third number of word lines. The third number of word lines may be less than the second number. In the example shown in FIG. 2, count value C_SubPortion0 tracks accesses to the word lines 202 between lines 206 and 220; count value C_SubPortion1 tracks accesses to the word lines 202 between lines 220 and 222; count value C_Subportion2 tracks accesses to the word lines 202 between lines 222 and 224; and count value C_Subportion3 tracks accesses to the word lines 202 between lines 224 and 208. As shown in FIG. 2, all of the sub-portions of the word lines 202 associated with the count values C_Subportion0-3 may correspond to all of the word lines 202 in the portion indicated by box 218, which is the portion tracked by count value C_Portion0 of the first storage device 204. In other examples, a C_SubPortion0-3 may be assigned to correspond to all of the word lines 202 tracked by C_Portion0, C_Portion1, or C_Portion2.

Optionally, according to principles of the present disclosure, sub-portions of a sub-portion of the word lines 202 indicated by box 218 may be tracked by a third storage device 226. Box 228 indicates the portion of word lines 202 associated with count value C_SubPortion0 in storage device 214. As an example, this same portion of word lines 202 is illustrated in box 230. The third storage device 226 may store a number of count values C_SubSub0-1. Each count value C_SubSub0-1 may be associated with a portion of the word lines 202 in the portion of word lines 202 indicated by box 228, which is in turn a portion of the word lines 202 indicated by box 216. The portion of word lines 202 indicated by box 230 may include the third number of word lines. Each count value C_SubSub0-1 may be associated with a fourth number of word lines. The fourth number of word lines may be less than the second number. In the example shown in FIG. 2, count value C_SubSub0 tracks accesses to the word lines 202 between lines 206 and 232 and count value C_SubSub1 tracks accesses to the word lines 202 between 232 and 220. As shown in FIG. 2, all of the word lines 202 associated with the count values C_SubSub0-1 may correspond to all of the word lines 202 in the portion indicated by box 230, which is the portion tracked by count value C_SubPortion0 of the second storage device 214. In other examples, a C_SubSub0-1 may be assigned to correspond to all of the word lines 202 tracked by C_SubPortion0, C_SubPortion1, C_SubPortion2, or C_SubPortion3.

As illustrated by FIG. 2, accesses to word lines in a memory may be tracked with increasing granularity by multiple storage devices. For example, the portions monitored by the first storage device 204 include a larger number of word lines than the portions monitored by the second storage device 214. While the number of count values (C_Portion0-2) in the first storage device 204 is less than the number of count values (C_SubPortion0-3) in the second storage device 214 in the example shown in FIG. 2 (e.g., storage device 204 has three count values while storage device 214 has four count values), in some embodiments, the number of count values in the first storage device 204 may be greater than the number of count values in storage device 214. In addition to reducing a number of victim addresses generated, using multiple storage devices to track row accesses may reduce the total area dedicated to storage devices for tracking word line accesses in some embodiments.

It should be noted that the accesses to particular word lines by particular count values in the storage devices 204 and 214 discussed above are provided for explanatory purposes only and the principles of the present disclosure are not limited to the examples discussed above. For example, any count value C_SubPortion0-3 of storage device 214 may be assigned to word lines associated with any of the count values C_Portions0-2 of storage device 204.

Figure 3:
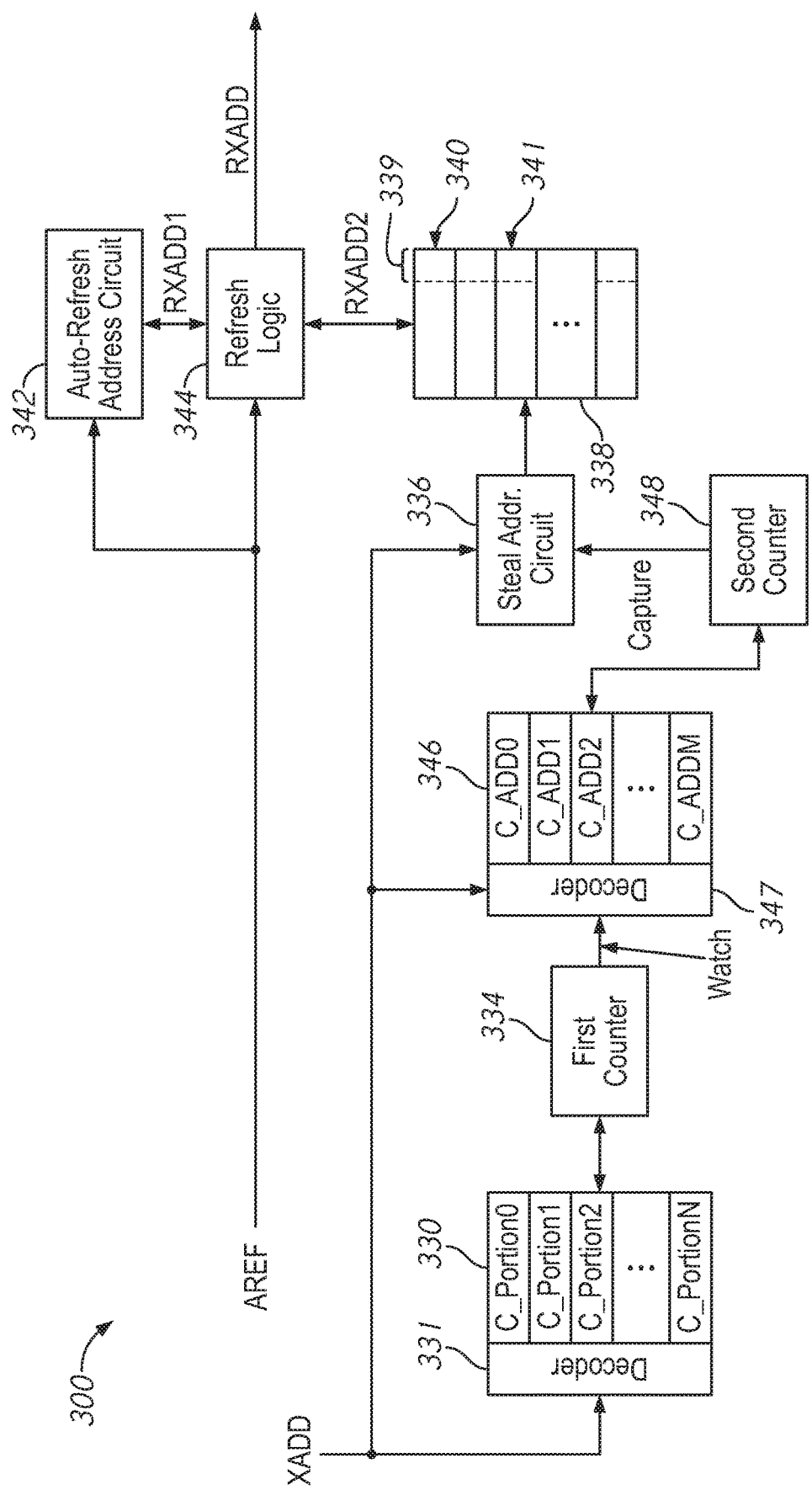
FIG. 3 is a block diagram of a refresh control circuit according to an embodiment of the present disclosure.

FIG. 3 is a block diagram of a refresh control circuit according to an embodiment of the present disclosure. The refresh control circuit 300 may be included in the refresh control circuit 116 of FIG. 1 in some embodiments. The refresh control circuit 300 receives a row address XADD (e.g., from the address decoder 104 of FIG. 1) and the refresh signal AREF, and provides a refresh address RXADD with a timing based on AREF. The refresh address RXADD may either be an auto-refresh address RXADD1 as part of an auto-refresh operation, or a targeted refresh address RXADD2 as part of a targeted refresh operation. The targeted refresh addresses RXADD2 may be determined based on tracking the row addresses XADD over time.

The refresh control circuit 300 includes a main counter stack 330 (and its associated decoder 331) which stores count values (C_Portion0-N), each associated with a portion of the word lines of the memory. A first counter logic circuit 334 may update a count value (e.g., C_Portion2) in the main counter stack 330 based on the row address XADD. In some embodiments the first counter logic circuit 334 may update the count value by incrementing the count value and may provide a signal Watch when the incremented count value exceeds a first threshold. In other embodiments the first counter logic circuit 334 may decrement the count value and may provide the signal Watch if the count value is below the first threshold. Other methods of updating and checking a value of the count values may be used in other embodiments. After the signal Watch is provided, the count value may be adjusted (e.g., reduced). In some embodiments, after the signal Watch is provided, the count value may be adjusted to a value between an initial value (e.g., 0) and the threshold value. For example, the count value may be set to a value of half the threshold value. In some embodiments, the first counter logic circuit 334 may receive a threshold signal (not shown), which may set a value of the first threshold.

The refresh control circuit 300 includes a sub-counter stack 346 (and its associated decoder 347) which stores count values (C_ADD0-M), each associated with a sub-portion of a portion of the word lines of the memory. The sub-counter stack 346 may receive the signal Watch from the first counter logic circuit 334. Based on the signal Watch, the sub-counter stack 346 may assign count values to sub-portions of the portion of the word lines of the memory whose count value exceeded the first threshold value in the main counter stack 230. For example, if the count value C_Portion2 of main counter stack 330 exceed the first threshold value, the count values C_ADD0-M may each be associated with different sub-portions of the portion of word lines whose accesses were tracked by the count value C_Portion2.

A second counter logic circuit 348 may update a count value (e.g., C_ADD1) in the sub-counter stack 346 based on the row address XADD. In some embodiments the second counter logic circuit 348 may update the count value by incrementing the count value and may provide a signal Capture when the incremented count value exceeds a second threshold. In other embodiments the second counter logic circuit 348 may decrement the count value and may provide the signal Capture if the count value is below the second threshold. Other methods of updating and checking a value of the count values may be used in other embodiments. In some embodiments, the second threshold value is greater than the first threshold value. After the signal Capture is provided, the count value may be reset to an initial value (e.g., 0 or the first threshold value). In some embodiments, the second counter logic circuit 348 may receive a threshold signal (not shown), which may set a value of the second threshold.

In some embodiments, instead of comparing the count values C_ADD0-M to a threshold value, the counter logic circuit 348 may compare the count values C_ADD0-M to one another and provide the address with the highest count value as the signal Capture.

In some embodiments, after the signal Capture is provided, the second counter logic circuit 348 may reset all of the count values C_ADD0-M in the sub-counter stack 346, not just the count value that triggered the signal Capture. This may indicate that the sub-counter stack 346 is available to monitor accesses to a different portion of word lines in the memory. However, if word lines in multiple sub-portions are being hammered, resetting all of the count values in sub-counter stack 346 may cause the refresh control circuit 300 to only respond to row hammers in a single sub-portion. This issue may be mitigated when, as described above, the first counter logic circuit 334 adjusts a count value in the main counter stack 330 to an intermediate value rather than resetting the count value. The intermediate value may permit the portion of word lines to again be monitored by the sub-counter stack 346 after a shorter period such that multiple row hammers in the portion of word lines may be mitigated by the refresh control circuit 300 before data in victim word lines is compromised.

In some embodiments, the sub-counter stack 346 may continue monitoring the portion of word lines of the memory for a period of time and provide the signal Capture as necessary until the period of time expires. For example, the period of time may be the time necessary for auto-refresh operations to cycle through all of the word lines in the memory or portion of word lines in the memory. After the period of time expires, all of the count values in the sub-counter stack 346 may be reset and the sub-counter stack 346 may be available to monitor another portion of word lines of the memory. In some embodiments, the count values of the sub-counter stack 346 may be reset and the sub-counter stack 346 may be available to monitor another portion of word lines of the memory if the signal Capture is not sent within a period of time.

An address circuit 336 may provide victim addresses based on the current row address XADD when the signal Capture is provided. The victim addresses are stored in a targeted refresh queue 338. With timing based on AREF, a refresh logic circuit 344 may provide either an auto-refresh address RXADD1 provided by an auto-refresh address circuit 342, or a targeted refresh address RXADD2 from the targeted refresh queue 338.

Since the two counter stacks 330 and 346 may generally function in a similar manner, for the sake of brevity, only the main counter stack 330 will described in detail. It should be understood that sub-counter stack 332 may function in a similar manner, except that it may include counter values which are associated with only one portion of the word lines of the memory.

The main counter stack 330 may be a stack of registers, each of which may store a count value. Each register (or 'file') of the main counter stack 330 may include a number of latch circuits, each of which may store a bit of information. The number of bits stored in each register may generally be referred to as a width of the stack 330. Together, the bits of each register may represent a number in binary. The number of bits used to represent the count value (e.g., the width of the registers) may be based on a threshold value. In some embodiments, the threshold may be about 3,000, and each register may include 12 latch circuits, and thus the count value may be stored as a 12 bit number (e.g., a number from 0 to 4,095). Other widths of the registers may be used in other example embodiments. In some embodiments, the registers in the main counter stack 330 and the registers in the sub-counter stack 346 may have different widths. In some embodiments, the first threshold value may be 1,000 and the second threshold value may be 3,000.

The decoder 331 may receive the row address XADD and provide one of the count values from the main counter stack 330 to the counter logic circuit 334 based on a value of a subset of the bits of the row address XADD. Each of the count values of the row counter stack 330 may be associated with a portion of the word lines of the memory. Each portion of the word lines may be specified by a value of the subset of the bits of the row address XADD. Each of the count values may be associated with a particular value of the subset of the bits of the row address. Thus, there may be a first count value for a first value of the subset of the row address, a second count value for a second value of the subset of the row address, etc. If the subset of the row address has N possible values, then the row count stack 330 may be N registers deep. In some embodiments, the main counter stack 330 may have a different number of registers (e.g., N) than the sub-counter stack 346 (e.g., M). In some embodiments, the main counter stack 330 and sub-counter stack 346 may have the same number of registers (e.g., N equals M). In some embodiments, M may be smaller than N.

For example, in some embodiments the row address may be 17 bits long to represent 2^17 total word lines in a bank (not including the redundant word lines). The fourth through sixteenth bits (e.g., RA3-16) may be a section address which represents a particular section of the memory, with each section containing 8 word lines, which are addressed by the first through third bits (e.g., RA0-RA2) as a word line address. The decoder 331 may group some of the sections together by ignoring some of the bits of the section address, which may be considered to be a multi-section address. For example the decoder 331 may only pay attention to a multi-section address including the fourth through thirteenth bits of the row address (e.g., RA3-RA12) such that each multi-section address represents sixteen of the sections. Each count value in the main counter stack 330 may be associated with a value of the multi-section address (e.g., RA3-RA12). Thus the main counter stack 330 may be 1024 registers 'deep', one for each of the values of the multi-section address RA3-RA12 (e.g., 2^10 total values). Each count value in such a stack may represent eight word lines (since the word line address is ignored) in each of 16 different sections of the memory (since the section address is truncated into a multi-section address). Thus, in this example embodiment, each count value represents 128 total word lines. Different organizations of the memory and the row address may be used in other examples. In other embodiments, the row address may have more (or fewer) bits to represent more or fewer word lines of a memory.

The sub-counter stack 346 may generally be identical to the main counter stack 330, except the count values in the sub-counter stack 346 may be associated with sub-portions of a portion of the word lines of the memory. Continuing the example from the previous paragraph, a portion of word lines includes 128 total word lines which may be divided equally between sub-portions of the sub-counter stack 346. For example, if accesses to individual word lines is desired, the sub-counter stack 346 may be 128 registers deep, where each count value is associated with a single word line. If a smaller stack is desired, multiple word lines may be included in each sub-portion. For example, the 128 word lines may be grouped into sub-portions including eight word lines. In this example, the sub-counter stack 346 may be 16 registers deep. The decoder 347 may receive the row address XADD and provide one of the count values from the sub-counter stack 346 to the counter logic circuit 348 based on a value of a subset of the bits of the row address XADD. In some embodiments, the subset of bits of the row address XADD may be based, at least in part, on the signal Watch provided by the first counter logic circuit 334. The signal Watch may indicate which portion of the word lines the sub-counter stack 346 is assigned to monitor and the subset of bits may be based on the portion assigned to the sub-counter stack 346. Thus, in some embodiments, the word lines of the memory associated with each count value in the sub-counter stack 346 may be dynamically assigned.

Responsive to the signal Capture provided by the second counter logic circuit 348, the address circuit 336 may determine and provide victim addresses based on the row address XADD (e.g., the same row address that caused Capture to be provided). The steal address circuit 336 may only receive (and/or only pay attention to) a subset of the bits of the row address XADD. In some embodiments, the address circuit 336 may use the same subset of the row address as the sub-counter stack 346. The address circuits 336 may provide a number of victim addresses which include victim addresses associated with all of the word lines represented by the subset of the row address. In some embodiments, each victim address may represent multiple word lines of the memory, and all of the word lines represented by a given victim address may be refreshed simultaneously. In some embodiments, each victim address may represent a single word line of the memory. In some applications, using the same subset of the bits of the row address XADD as the sub-counter stack 346 may result in the generation of a smaller number of victim row addresses than if the address circuit 336 used the same subset of the bits of the row address XADD as the main counter stack 330.

In other embodiments, the sub-counter stack 346, instead of having a decoder 347, may include additional fields for storing row addresses of word lines corresponding to the row address XADD. Each counter C_ADD0-M may be associated with a row address in the sub-counter stack 346. In these embodiments, instead of capturing the current row address XADD, the sub-counter stack 346 may provide one or more stored row addresses to the address circuit 336. The address circuit 336 may then use the received row address to generate the victim row addresses.

The targeted refresh queue 338 may be a register stack which stores the victim addresses provided by the address circuit 336. Each register of the targeted refresh queue 338 may include a number of bits to store a victim address provided by the address circuit 336. Each register of the targeted refresh queue 338 may also include one or more bits which represent an empty flag 339. In some embodiments, the empty flag 339 may be a single bit, which may be at a low logical level when a victim address is stored in that register which has not been refreshed (e.g., to indicate that the register is full), and may be at a high logical level when there is either no victim address stored in the register, or the victim address has already been refreshed (e.g., to indicate that the register is empty and ready to store a new victim address).

The targeted refresh queue 338 includes an extraction pointer 340 and an insertion pointer 341. The extraction pointer 340 indicates a register which is the next to provide a victim address as the targeted refresh address RXADD2. The insertion pointer 341 indicates a register where the next victim address should be added to the targeted refresh queue 338. After a victim address is extracted, the extraction pointer 340 may move to a next register in the targeted refresh queue 338. After an address is inserted into a register, the insertion pointer 341 may move to a next register in the targeted refresh queue 338. After reaching a last register in the targeted refresh queue 338, the pointers 340, 341 may return to a first register in the targeted refresh queue 338. In some embodiments, the targeted refresh queue 338 may be, for example, 100 registers deep.

Alternatively, in some embodiments, the positions of the address circuit 336 and targeted refresh queue 338 may be reversed. That is, the targeted refresh queue 338 may capture the current row address XADD responsive to the signal Capture and the aggressor rows may be stored in the targeted refresh queue 338. Then, for each targeted refresh operations, the address circuit 336 may receive an address from the targeted refresh queue 338 and calculate one or more victim addresses based on the aggressor address provided by the targeted refresh queue 338.

The refresh logic circuit 344 provides the refresh address RXADD with a timing based on the signal AREF. In some embodiments, the refresh logic circuit 344 may provide a refresh address RXADD each time there is an occurrence of AREF. In some embodiments, the refresh logic circuit 344 may provide multiple refresh addresses RXADD responsive to each occurrence of AREF. For example, the refresh logic circuit 344 may provide a set number of 'pumps' responsive to receiving an occurrence of AREF, and a refresh address RXADD may be provided for each pump.

Each time the refresh logic circuit 344 provides a refresh address RXADD, either an auto-refresh address RXADD1 or a targeted refresh address RXADD2 may be provided as the refresh address RXADD. The auto-refresh address RXADD1 may be provided by an auto-refresh address circuit 342. Each auto-refresh address RXADD1 may be associated with a number of word lines of the memory. After an auto-refresh address RXADD1 is provided, the auto-refresh address circuit 342 may provide a next auto-refresh address RXADD1 associated with a next group of word lines in a sequence. The auto-refresh address circuit 342 may provide the auto-refresh addresses RXADD1 in a sequence such that over time all the word lines of the memory array are refreshed by the auto-refresh addresses RXADD1. After a last auto-refresh address RXADD1 in the sequence is provided, the first auto-refresh address RXADD1 in the sequence may be provided again. In some embodiments, the auto-refresh address circuit 342 may determine the sequence of auto-refresh addresses with internal logic. For example, one or more portions of the auto-refresh address RXADD1 may be incremented after each auto-refresh address RXADD1 is provided to determine a next auto-refresh address RXADD1.

In some embodiments, the refresh logic circuit 344 may determine whether to provide an auto-refresh address RXADD1 or a targeted refresh address RXADD2 based on the state of the targeted refresh queue 338. In some embodiments, the refresh logic circuit 344 may provide targeted refresh addresses RXADD2 from the targeted refresh queue 338 as the refresh address RXADD as long as there is at least one victim address stored in the targeted refresh queue 338 and may provide the auto-refresh address RXADD1 as the refresh address RXADD if the targeted refresh queue 338 is empty. For example, the refresh logic circuit 344 may determine if the targeted refresh queue 338 is empty based on a state of the empty flags 339. If all of the empty flags 339 are at a high logical level, then it may indicate that the targeted refresh queue 338 is empty, and the refresh logic circuit 344 may provide an auto-refresh address RXADD1 as the refresh address RXADD.

Each targeted refresh address RXADD2 may be one of the victim addresses stored in the targeted refresh queue 338. Each time a targeted refresh address RXADD2 is provided, the empty flag 339 in the register of the targeted refresh queue 338 that contained that address RXADD2 may be raised to a high logical level to indicate that the register is now empty.

In other embodiments, the refresh logic circuit 344 may provide the refresh address RXADD with set timeslots for targeted refresh addresses RXADD2 and auto-refresh addresses RXADD1. For example, the refresh logic circuit 244 may provide the auto-refresh address RXADD1 a certain number of times, and then provide the targeted refresh RXADD2 a number of times, and then start providing auto-refresh addresses RXADD1 again. In some embodiments, when the targeted refresh queue 338 is empty and the refresh logic circuit 344 would provide a targeted refresh address RXADD2, the refresh logic circuit 344 may skip providing the targeted refresh address and provide an auto-refresh address instead. In other embodiments, when the targeted refresh queue 338 is empty, during a targeted refresh timeslot, no address may be provided, and a refresh operation may not be performed.

In some applications, multiple portions of word lines monitored by the main counter stack 330 may cross the first threshold value in a short period of time. Accordingly, it may be desirable to include multiple sub-counter stacks 346 to simultaneously monitor multiple portions of word lines. Furthermore, in some applications, the sub-portions of the sub-counter stack 346 may still correspond to a large number of word lines which require a significant number of victim addresses to be generated. Accordingly, it may be desirable to include multiple sub-counter stacks 346 to further prioritize the victim addresses to be generated.

Figure 4:
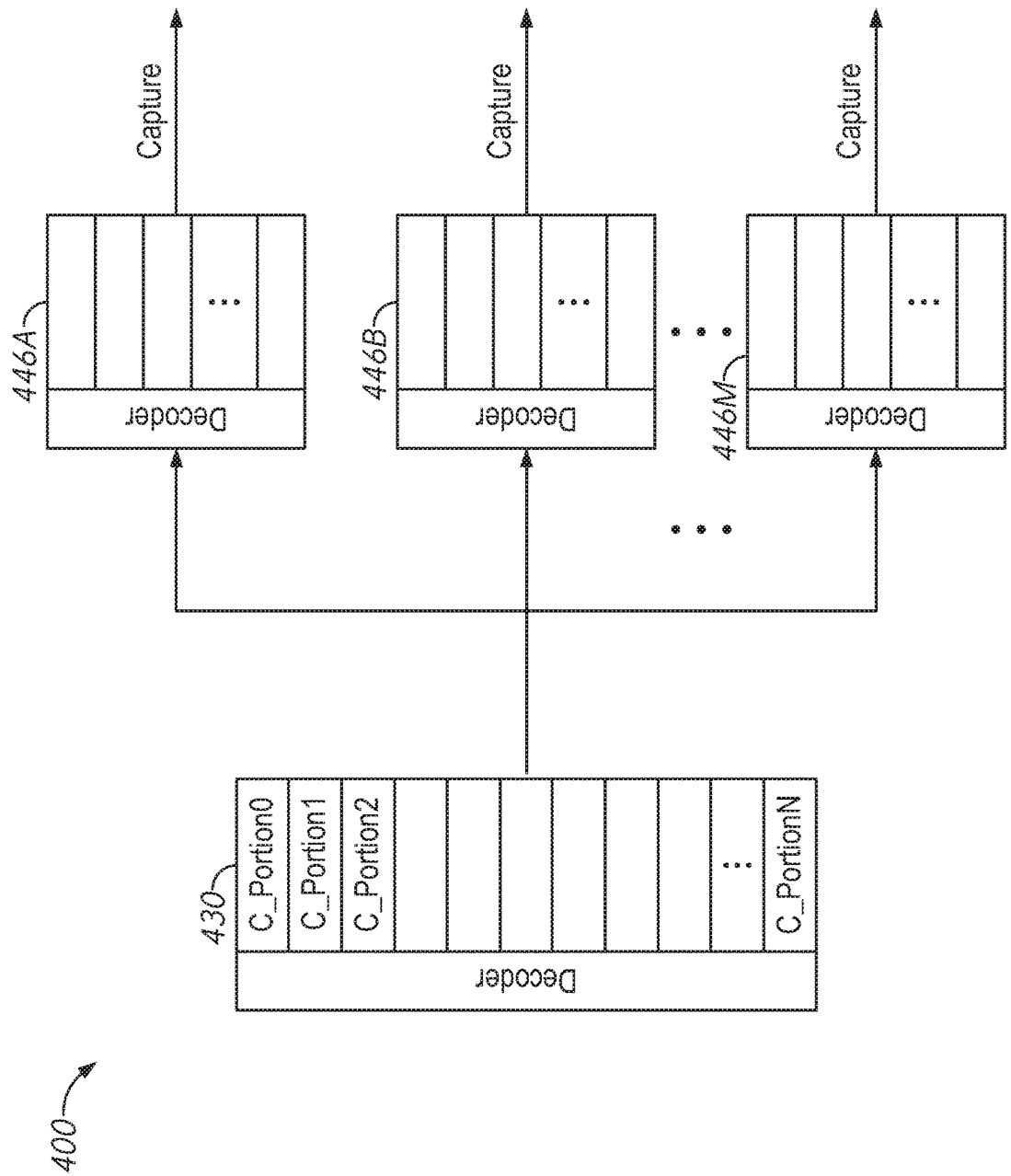
FIG. 4 is a block diagram of a portion of a refresh control circuit according to an embodiment of the present disclosure.

FIG. 4 is a block diagram of a portion of a refresh control circuit according to an embodiment of the present disclosure. The refresh control circuit 400 may be included in the refresh control circuit 116 of FIG. 1 and/or the refresh control circuit 300 in FIG. 3 in some embodiments. The refresh control circuit 400 may include a main counter stack 430 and multiple sub-counter stacks 446A-M. For simplicity, the counter logic circuits, steal address circuits, and other components of the refresh control circuit have been omitted.

The main counter stack 430 may have a structure and operation similar to that of main counter stack 330 shown in FIG. 3. When a count value associated with a particular portion of word lines of the memory, for example, C_Portion0, crosses a first threshold value, accesses to sub-portions of the portion of word lines of the memory associated with C_Portion0 may be tracked by one of the sub-counter stacks, for example, sub-counter stack 446A. The sub-counter stacks 446A-M may each operate in a similar manner to sub-counter stack 346 shown in FIG. 3.

If a second count value associated with another particular portion of word lines of the memory, for example, C_Portion2, crosses the first threshold value, accesses to sub-portions of the portion of word lines of the memory associated with C_Portion2 may also be tracked by one of the sub-counter stacks, for example, sub-counter stack 446B. Both sub-counter stacks 446A and 446B may provide Capture signals (e.g., via counter logic circuits not shown) as necessary when count values associated with sub-portions of the portion of word lines exceed a second threshold value.

Typically, the number of sub-counter stacks 446A-M is less than the number of count values in the main counter stack 430. Including multiple sub-counter stacks 446A-M may allow parallel tracking of accesses to different portions of word lines in the memory. This may permit mitigation of row hammers in different portions of word lines that occur simultaneously or in quick succession.

Figure 5:
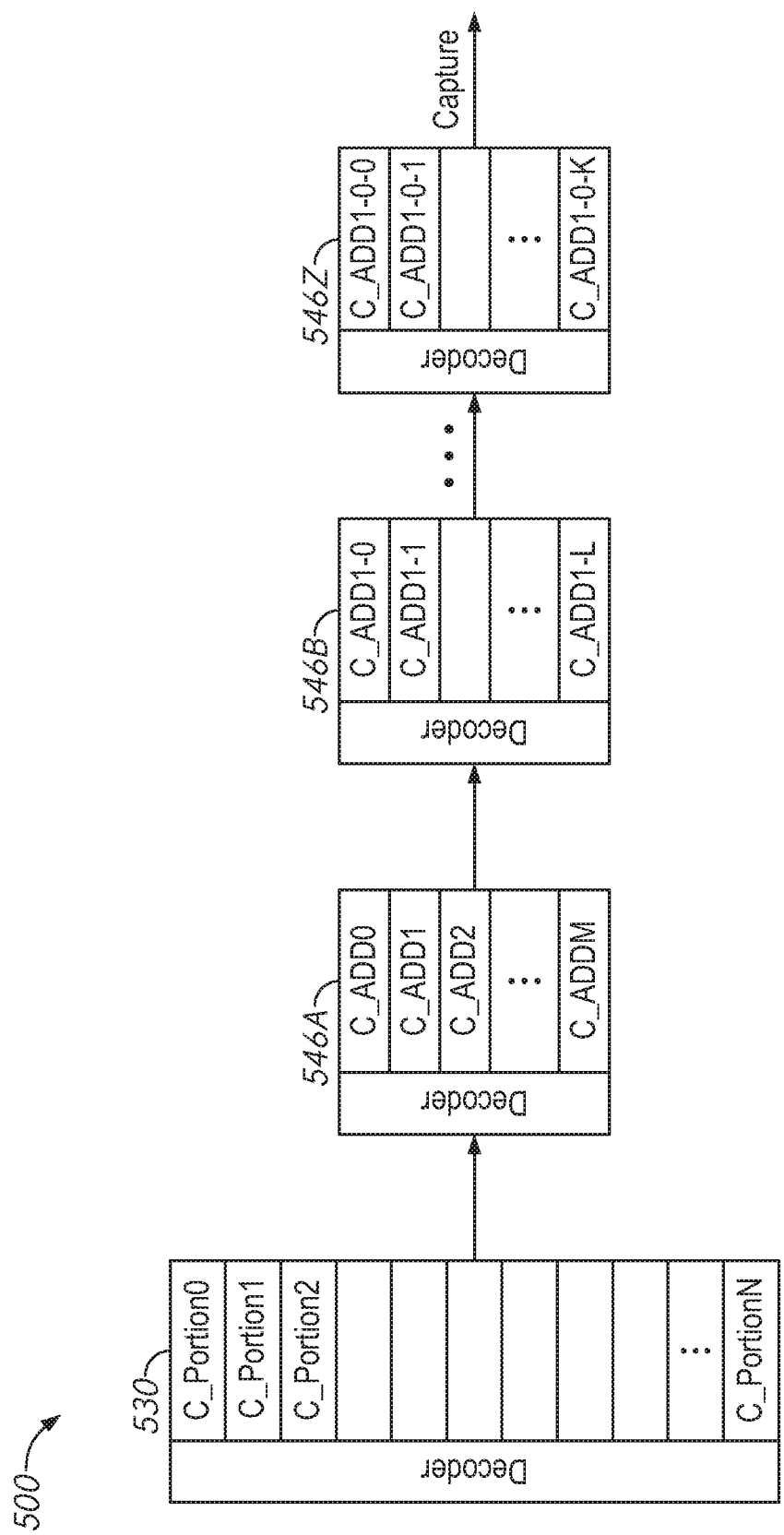
FIG. 5 is a block diagram of a portion of a refresh control circuit according to an embodiment of the present disclosure.

FIG. 5 is a block diagram of a portion of a refresh control circuit according to an embodiment of the present disclosure. The refresh control circuit 500 may be included in the refresh control circuit 116 of FIG. 1, the refresh control circuit 300 in FIG. 3 in some embodiments. In some embodiments, the portion of the refresh control circuit 500 may be combined with the portion of the refresh control circuit 400 in FIG. 4. The refresh control circuit 500 may include a main counter stack 530, and multiple sub counter stacks 546A-Z. For simplicity, the counter logic circuits, steal address circuits, and other components of the refresh control circuit have been omitted.

The main counter stack 530 may have a structure and operation similar to that of main counter stack 330 shown in FIG. 3. When a count value associated with a particular portion of word lines of the memory, for example, C_Portion0, crosses a first threshold value, accesses to sub-portions of the portion of word lines of the memory associated with C_Portion0 may be tracked by the sub-counter stack 546A. The sub-counter stack 546A may track accesses to different sub-portions (C_ADD0-M) of the portion of word lines associated with the count value C_Portion0. When a count value associated with a particular sub-portion of word lines, for example, C_ADD1, crosses a second threshold value, accesses to sub-portions of the sub-portion of word lines of the memory associated with C_ADD1 may be tracked by the sub-counter stack 546B. The sub-counter stack 546B may track accesses to different sub-portions (C_ADD1-0-L) of the sub-portion of word lines associated with the count value C_ADD1. This process of continuing to monitor smaller sub-portions of the word lines of the memory may continue until a final sub-counter stack 546Z provides a signal Capture when a count value (CADD1-0-0-K) exceeds a final threshold value (e.g., via a final counter logic circuit not shown). The sub-counter stacks 546A-Z may each operate in a similar manner to sub-counter stack 346 shown in FIG. 3.

Including multiple sub-counter stacks 546A-Z in series with the main counter stack 530 may reduce a number of victim addresses required to be generated. For example, each count value C_Portion0-N may be associated with hundreds or possibly over 1,000 word lines. Continuing this example, each count value C_ADD0-M of sub-counter stack 546A may be associated with over a hundred word lines. Even if victim addresses are provided only for a single sub-portion of the word lines associated a count value CADD0-M of sub-counter stack 546A, this may still be more victim addresses than can be reasonably completed in the time allowed for targeted refresh operations. Furthermore, many of the word lines associated with the victim addresses are likely to not actually be victims of a row hammer. Providing additional sub-counter stacks 546B-Z may allow the sub-portion of word lines tracked by sub-counter stack 546A to be further sub-divided and tracked to reduce the number of victim addresses generated. For example, a number of word lines associated with a count value in sub-counter stack 546Z may be less than a number of word lines associated with a count value in sub-counter stack 546B. In some embodiments, the final sub-counter stack 546Z may have count values associated with individual word lines.

Furthermore, providing sub-counter stacks 546A-Z in series may allow the main counter stack 530 and/or sub-counter stacks 546A-Z to be shallower, that is, fewer registers may need to be included in the stack. The sizes of the main counter stack 530 and subsequent sub-counter stacks 546A-Z may be optimized based on the number of sub-counter stacks 546A-Z, threshold values, and/or number of victim addresses to be generated.

In some embodiments, the structure of the main counter stacks and sub-counter stacks shown in FIGS. 4 and 5 may be combined. For example, there may be multiple sub-counter stacks provided in parallel with the main counter stack and each of the parallel sub-counter stacks may be connected in series with one or more sub-counter stacks.

Figure 6:
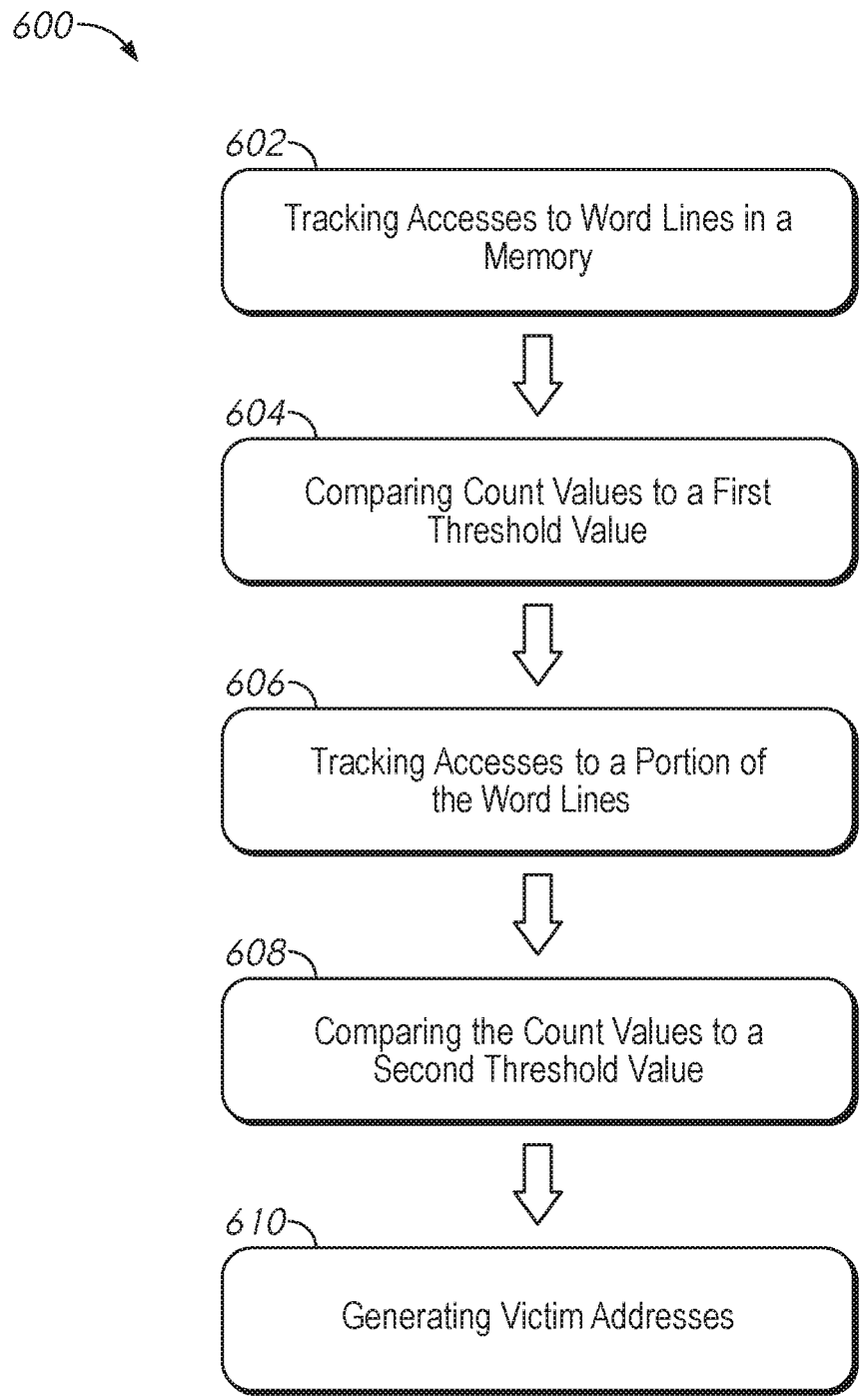
FIG. 6 is a flow chart of a method according to an embodiment of the disclosure.

FIG. 6 is a flow chart of a method 600 according to an embodiment of the disclosure. In some embodiments, the method 600 may be performed by the refresh control circuit 116 of FIG. 1 and/or the refresh control circuit 300 of FIG. 3. In some embodiments, some or all of the method 500 may be performed by the portion of the refresh control circuit 400 shown in FIG. 4 and/or the portion of the refresh control circuit 500 shown in FIG. 5.

At block 602, a step of "Tracking accesses to word lines in a memory" may be performed. Tracking accesses may include monitoring row addresses received from a row decoder and updating corresponding count values in a register stack in some embodiments. Each of the count values may be associated with a portion of the word lines in the memory. At block 604, a step of "Comparing count values to a first threshold value" may be performed. If one of the count values meets or exceeds the first threshold value, at block 606, a step of "Tracking accesses to a portion of the word lines" may be performed. Tracking accesses may include monitoring row addresses received from the row decoder and updating corresponding count values in a second register stack in some embodiments. Each of the count values may be associated with a sub-portion of the portion of word lines in the memory. In some embodiments, the sub-portions are mutually exclusive. That is, none of the sub-portions include the same word lines of the portion of word lines.

At block 608, a step of "Comparing count values to a second threshold value," may be performed. In some embodiments, the second threshold value may be greater than the first threshold value. If one of the count values meets or exceeds the second threshold value, at block 610, a step of "Generating victim addresses" may be performed. In some embodiments, the victim addresses may be based off of the word lines of the sub-portion associated with the count value that exceeded the second threshold value.

In some embodiments, between blocks 604 and 606, the count value associated with the portion of the word lines that exceeded the first threshold value may be adjusted to a value between an initial value (e.g., 0) and the threshold value (e.g., 1,5000). In some embodiments, between blocks 608 and 610, the count value associated with the sub-portion of the word lines that exceeded the second threshold value may be reset to an initial value. In some embodiments, after block 610, the victim addresses may be provided to a targeted address queue for refreshing during subsequent refresh operations. In some embodiments, the steps in blocks 602 and 604 may continue to be performed as blocks 606, 608, and/or 610 are performed.

The apparatuses and methods described herein may allow for determining which sub-portion of a portion of word lines associated with a count value are being hammered and only refresh victim word lines associated with the sub-portion. This may reduce the number of victim addresses required to be generated and refreshed. In some applications, refreshing fewer victim word lines may reduce power consumption and/or operation time dedicated to targeted refresh operations. Furthermore, in some applications, by optimizing the size of the main counter stack and the one or more sub-counter stacks, the overall chip space required by the counter stack circuits may be reduced. In some applications, dividing the tracking between the main counter stack and the sub-counter stacks may provide flexibility when determining where to locate the counter stacks on the chip.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
  a dynamic random access memory array comprising a plurality of memory banks, individual ones of the memory banks comprising a plurality of word lines; and
  a refresh control circuit associated with one of the plurality of memory banks configured to identify an aggressor row, the refresh control circuit comprising:
    a first register stack configured to store a first plurality of count values, wherein each of the first plurality of count values is associated with a portion of the plurality of word lines;
    a first counter circuit configured to update a. first count value of the first plurality of count values responsive to receiving at the refresh control circuit a row address associated with the portion of the plurality of word lines associated with the first count value and configured to compare the updated first count value to a first threshold and provide a first signal when the updated first count value is greater than or equal to the first threshold;
    a second register stack configured to store a second plurality of count values, wherein each of the second plurality of count values is associated with a sub-portion of a selected one of the portions of the plurality of word lines;
    a second counter circuit configured to:
      update a second count value of the second plurality of count values responsive to receiving at the refresh control circuit a row address associated with the sub-portion associated with the second count value when the first signal is received; and
      configured to compare the updated second count value to a second threshold, wherein a word line associated with the row address is identified as the aggressor row when the updated second count value meets or exceeds the second threshold;
    an address circuit configured to provide a plurality of victim addresses based on the row address of the sub-portion of the portion of the plurality of word lines identified as the aggressor row; and
  a refresh address queue configured to store the plurality of victim addresses provided by the address circuit, wherein the refresh control circuit is configured to provide at least one of the plurality of victim of addresses for a refresh operation of a victim row associated with the at least one of the plurality of victim addresses.

2. The apparatus of claim 1, wherein the first plurality of count values represent all of the plurality of word lines.

3. The apparatus of claim 2, wherein the second plurality of count values represent all word lines in the selected one of the portions of the plurality of word lines.

4. The apparatus of claim 1, wherein the first threshold is less than the second threshold.

5. The apparatus of claim 1, wherein a number of registers in the first register stack is greater than a number of registers in the second register stack.

6. The apparatus of claim 1, wherein responsive to receiving the row address associated with the portion of the plurality of word lines associated with the first count value, the first register stack is configured to provide one of the first plurality of count values associated with the row address to the first counter circuit,
  wherein responsive to receiving the row address associated with the sub-portion associated with the second count value, the second register stack is configured to provide one of the second plurality of count values associated with the row address to the second counter circuit.

7. The apparatus of claim 1, wherein responsive to the second count value meeting or exceeding the second threshold, the second counter circuit is configured to provide a second signal to the address circuit,
  wherein responsive to the second signal, the address circuit is configured to provide the victim addresses, wherein the victim addresses correspond to word lines of the plurality of word lines that are physically adjacent to the row address determined to be the aggressor row.

8. The apparatus of claim 1, wherein the first counter circuit is configured to update the first count value by incrementing the first count value, and wherein after determining that the first count value is greater than the first threshold, the first counter circuit is further configured to reduce the first count value to a value between zero and the first threshold.

9. The apparatus of claim 1, wherein the second counter circuit is configured to update the second count value by incrementing the second count value, and wherein after determining that the second count value is greater than the second threshold, the second counter circuit is configured to provide a second signal and reset the second count value.

10. An apparatus comprising:
  a dynamic random access memory array comprising a plurality of memory banks, individual ones of the memory banks comprising a plurality of word lines; and
  a refresh control circuit associated with one of the plurality of memory banks configured to identify an aggressor row, the refresh control circuit comprising:
    a first register stack configured to store a first plurality of count values, wherein each of the first plurality of count values is associated with a portion of the plurality of word lines;
    a first counter circuit configured to update a. first count value of the first plurality of count values responsive to receiving at the refresh control circuit a row address associated with the portion of the plurality of word lines associated with the first count value and configured to compare the updated first count value to a first threshold and to update a second count value of the first plurality of count values responsive to receiving at the refresh control circuit a row address associated with the portion of the plurality of word lines associated with the second count value and configured to compare the updated second count value to the first threshold;
    a second register stack configured to store a second plurality of count values, wherein each of the second plurality of count values is associated with a sub-portion of the portion of the plurality of word lines associated with the first count value of the first plurality of count values;
    a second counter circuit configured to update a third count value of the second plurality of count values responsive to receiving at the refresh control circuit a row address associated with the sub-portion associated with the third count value when the first count value meets or exceeds the first threshold and configured to compare the updated third count value to a second threshold, wherein a word line associated with the row address is identified as the aggressor row when the updated third count value meets or exceeds the second threshold;
    a third register stack configured to store a third plurality of count values, wherein each of the third plurality of count values is associated with a sub-portion of the portion of the plurality of word lines associated with the second count value of the first plurality of count values;
    a third counter circuit configured to update a fourth count value of the third plurality of count values responsive to receiving at the refresh control circuit a row address associated with the sub-portion associated with the fourth count value when the second count value meets or exceeds the first threshold and configured to compare the updated fourth count value to a third threshold, wherein a word line associated with the row address is identified as the aggressor row when the updated fourth count value meets or exceeds the third threshold; and
    a refresh address queue configured to store a plurality of victim addresses associated with the aggressor row, wherein the refresh control circuit is configured to provide at least one of the plurality of victim of addresses for a refresh operation of a victim row associated with the at least one of the plurality of victim addresses.

11. The apparatus of claim 10, wherein the second register stack and the third register stack include a same number of registers.

12. The apparatus of claim 10, wherein the second threshold and the third threshold are equal.

13. The apparatus of claim 10, further comprising an address circuit configured to provide the plurality of victim addresses based on at least one of the aggressor row associated with the sub-portion of the portion of the plurality of word lines associated with the first count value or the aggressor row associated with the sub-portion of the portion of the plurality of word lines associated with the second count value.

14. The apparatus of claim 10, wherein the portion of the plurality of word lines associated with the first count value of the first plurality of count values does not include word lines in the portion of the plurality of word lines associated with the second count value of the first plurality of count values.

15. The apparatus of claim 10, further comprising a fourth register stack configured to store a fourth plurality of count values, wherein each of the fourth plurality of count values is associated with a sub-portion of the sub-portion of the portion of the plurality of word lines associated with the third count value of the second plurality of count values.

16. An apparatus comprising:
  a dynamic random access memory array comprising a plurality of memory banks, individual ones of the memory banks comprising a plurality of word lines;
  a refresh control circuit associated with one of the plurality of memory banks configured to identify an aggressor row, the refresh control circuit comprising:

a first register stack configured to store a first plurality of count values, wherein each of the first plurality of count values is associated with a first number of the plurality of word lines;

a second register stack configured to store a second plurality of count values, wherein each of the second plurality of count values is associated with a second number of the plurality of word lines, wherein the second number is less than the first number;

a third register stack configured to store a third plurality of count values, wherein each of the third plurality of count values is associated with a third number of the plurality of word lines, wherein the third number is less than the second number;

a first counter circuit configured to update a first count value of the first plurality of count values responsive to receipt of a row address associated with the first number of the plurality of word lines associated with the first count value and configured to compare the updated first count value to a first threshold;

a second counter circuit configured to update a second count value of the second plurality of count values responsive to receipt of a row address associated with the second number of the plurality of word lines associated with the second count value when the updated first count value meets or exceeds the first threshold and configured to compare the updated second count value to a second threshold;

a third counter circuit configured to update a third count value of the third plurality of count values responsive to receipt of a row address associated with the third number of the plurality of word lines associated with the third count value when the updated second count value meets or exceeds the second threshold and configured to compare the updated third count value to a third threshold, wherein a word line associated with the row address is identified as the aggressor row when the updated third count value meets or exceeds the third threshold; and a refresh address queue configured to store a plurality of victim addresses associated with the aggressor row, wherein the refresh control circuit is configured to provide at least one of the plurality of victim of addresses for a refresh operation of a victim row associated with the at least one of the plurality of victim addresses.

17. The apparatus of claim 16, wherein the third register stack further stores a plurality of row addresses each associated with corresponding ones of the third plurality of count values, wherein the plurality of row addresses correspond to the plurality of word lines of the third number of the plurality of word lines.

18. The apparatus of claim 16, further comprising an address circuit configured to provide the plurality of victim addresses based on the row address identified as associated with the aggressor row.

* * * * *